United States Patent
Tanaka

(10) Patent No.: US 9,590,006 B2
(45) Date of Patent: Mar. 7, 2017

(54) IMAGING APPARATUS MANUFACTURING METHOD AND ELECTRONIC APPARATUS INCLUDING SHIELDING MEMBERS CONNECTED TO HIGH IMPURITY CONCENTRATION REGIONS

(71) Applicant: Sony Corporation, Tokyo (JP)

(72) Inventor: Yusuke Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/985,106

(22) Filed: Dec. 30, 2015

(65) Prior Publication Data

US 2016/0111467 A1 Apr. 21, 2016

Related U.S. Application Data

(62) Division of application No. 14/222,133, filed on Mar. 21, 2014, now Pat. No. 9,252,174.

(30) Foreign Application Priority Data

Mar. 27, 2013 (JP) ................................ 2013-066635

(51) Int. Cl.
*H01L 21/00* (2006.01)
*H01L 27/146* (2006.01)

(52) U.S. Cl.
CPC .... *H01L 27/14685* (2013.01); *H01L 27/1463* (2013.01); *H01L 27/1464* (2013.01); *H01L 27/14603* (2013.01); *H01L 27/14609* (2013.01); *H01L 27/14623* (2013.01); *H01L 27/14636* (2013.01); *H01L 27/14641* (2013.01); *H01L 27/14643* (2013.01); *H01L 27/14687* (2013.01)

(58) Field of Classification Search
CPC ......... H01L 27/14623; H01L 27/14685; H01L 27/14643; H01L 27/1464
USPC ............................................. 438/48, 70, 80
See application file for complete search history.

(56) References Cited

U.S. PATENT DOCUMENTS

2010/0201834 A1* 8/2010 Maruyama .......... H01L 27/1464
348/222.1

* cited by examiner

*Primary Examiner* — Hung Vu
(74) *Attorney, Agent, or Firm* — Sheridan Ross P.C.

(57) ABSTRACT

There is provided a solid-state imaging apparatus including a plurality of photoelectric conversion regions which photoelectrically convert light incident from a rear surface side of a semiconductor substrate, element isolation regions formed between the plurality of photoelectric conversion regions arranged in a matrix shape, and shielding members formed on upper surfaces of the element isolation regions. The element isolation regions have high impurity concentration regions of a high impurity concentration connected to at least a part of the shielding members.

20 Claims, 20 Drawing Sheets

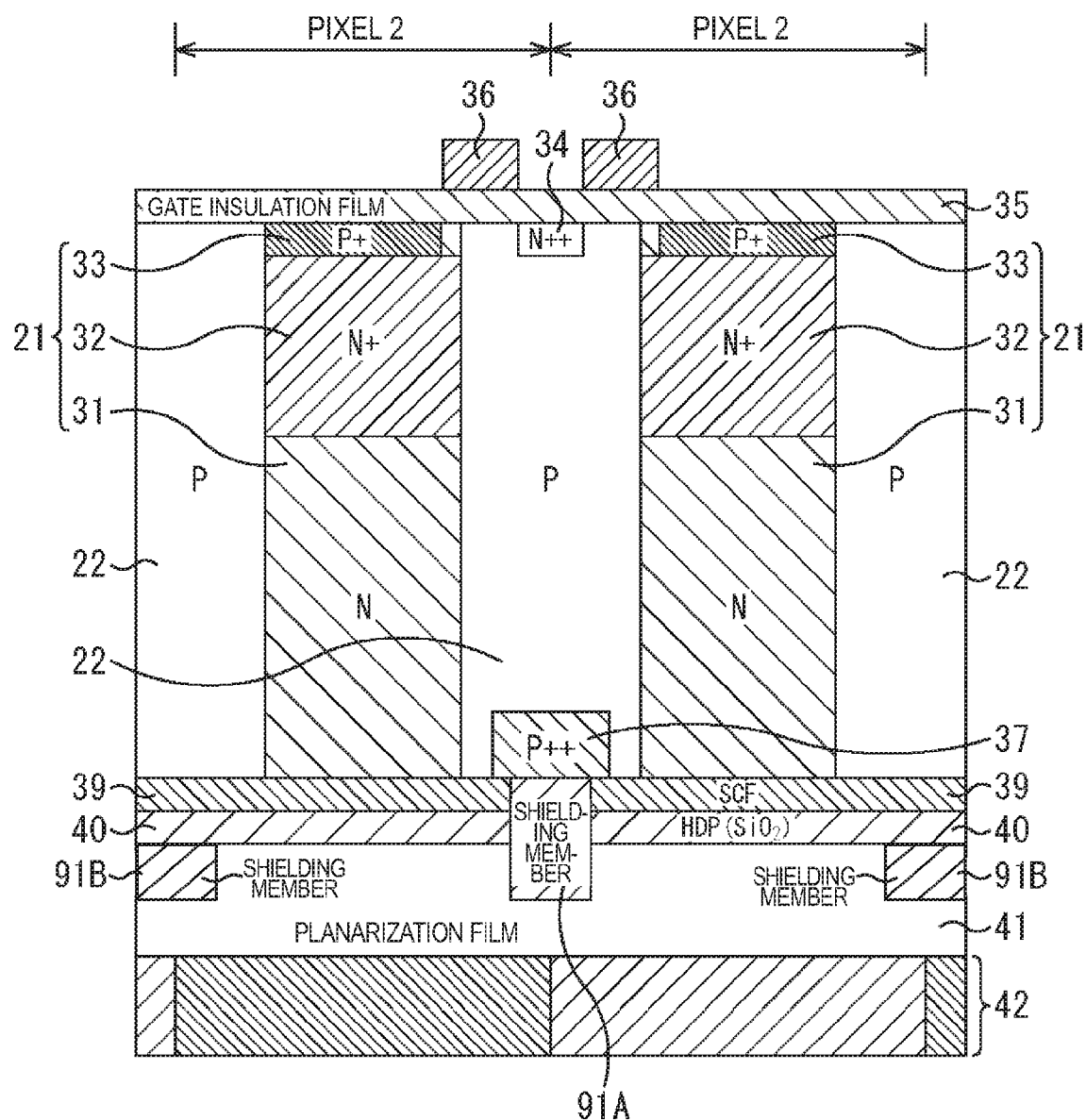

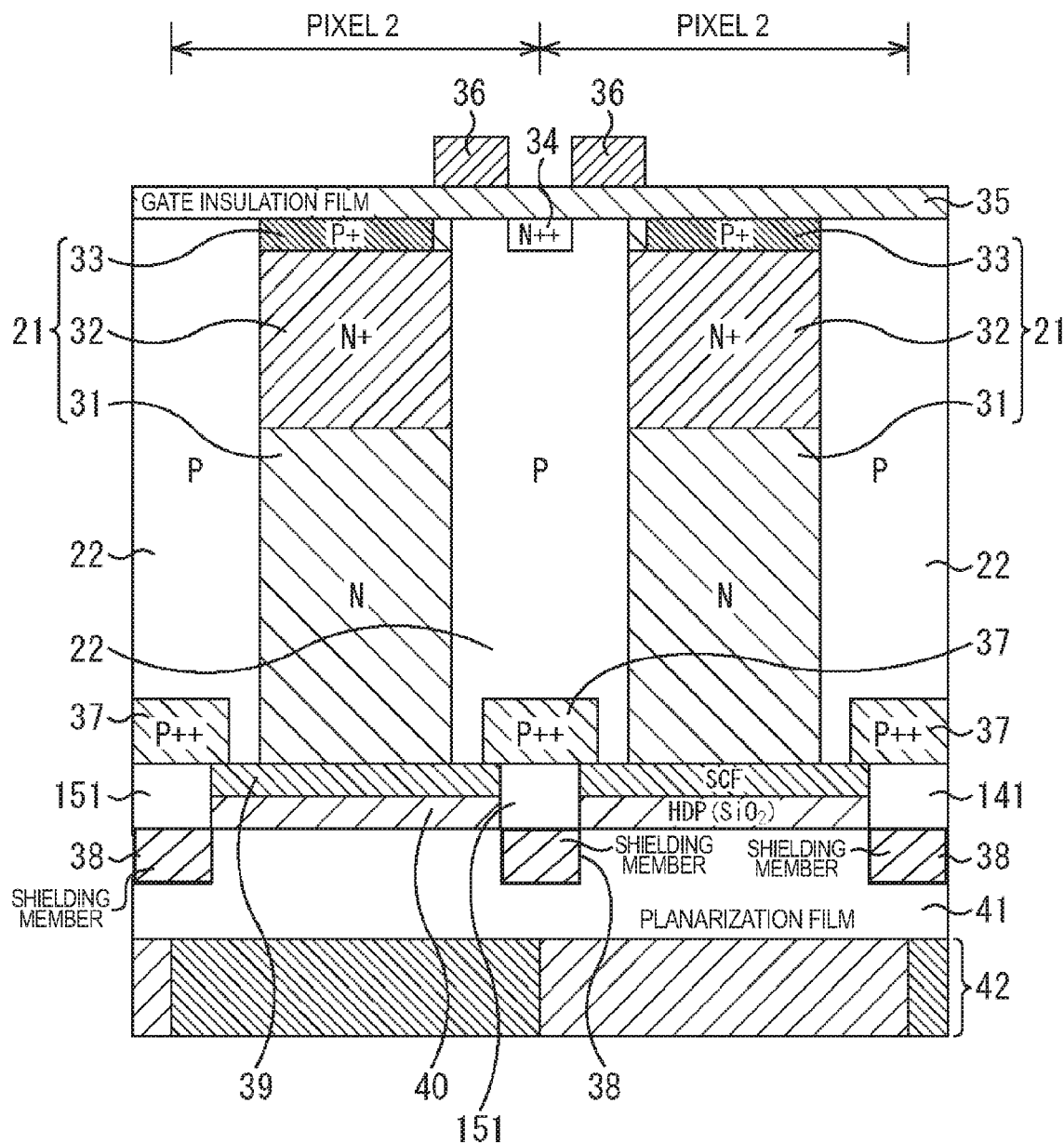

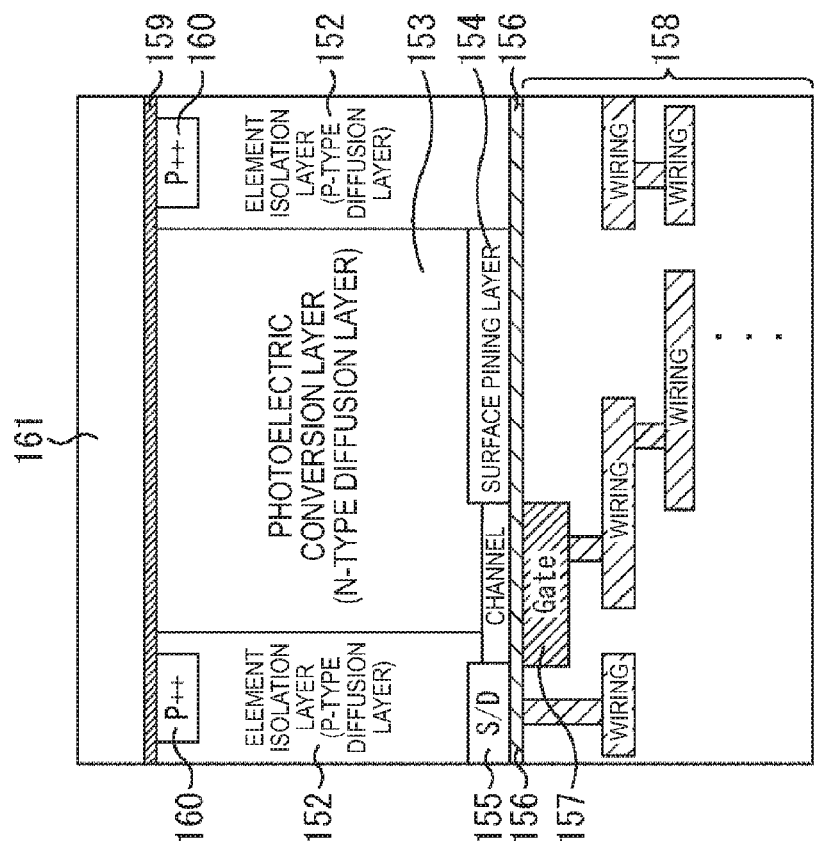
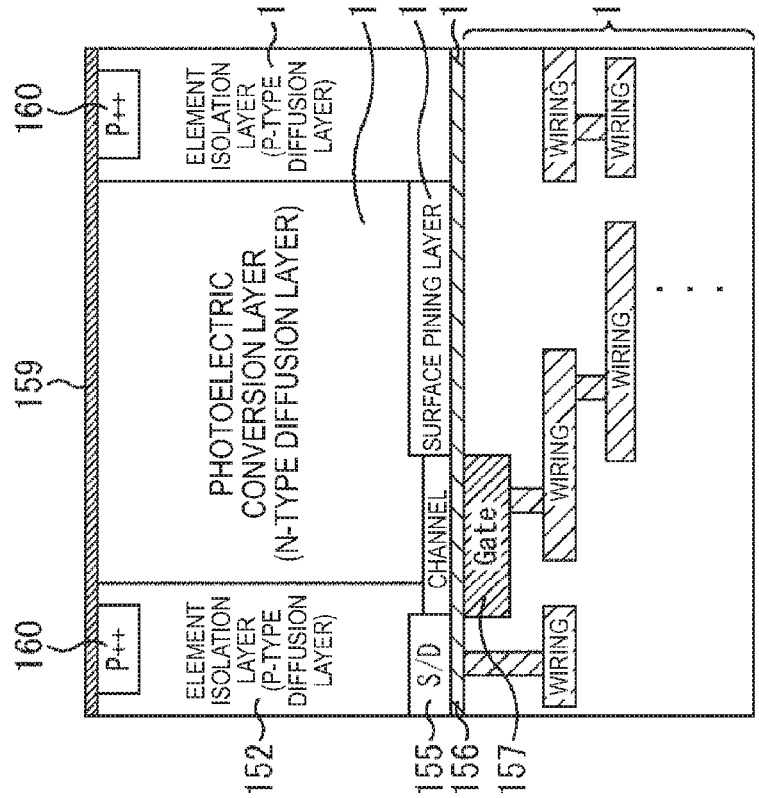

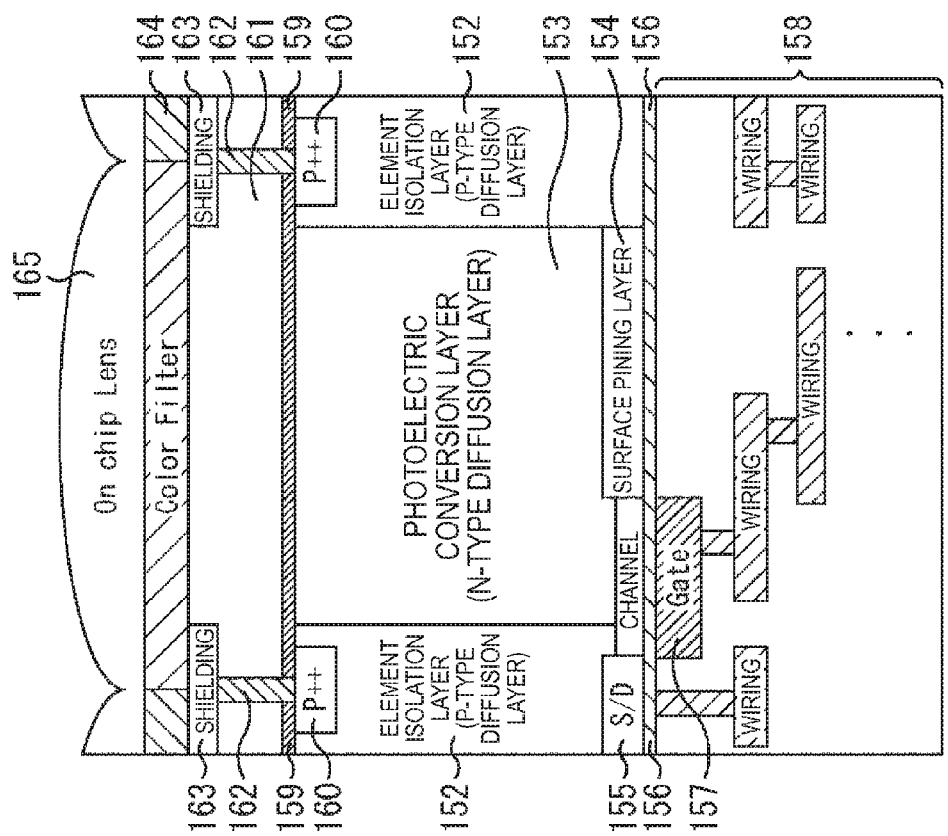
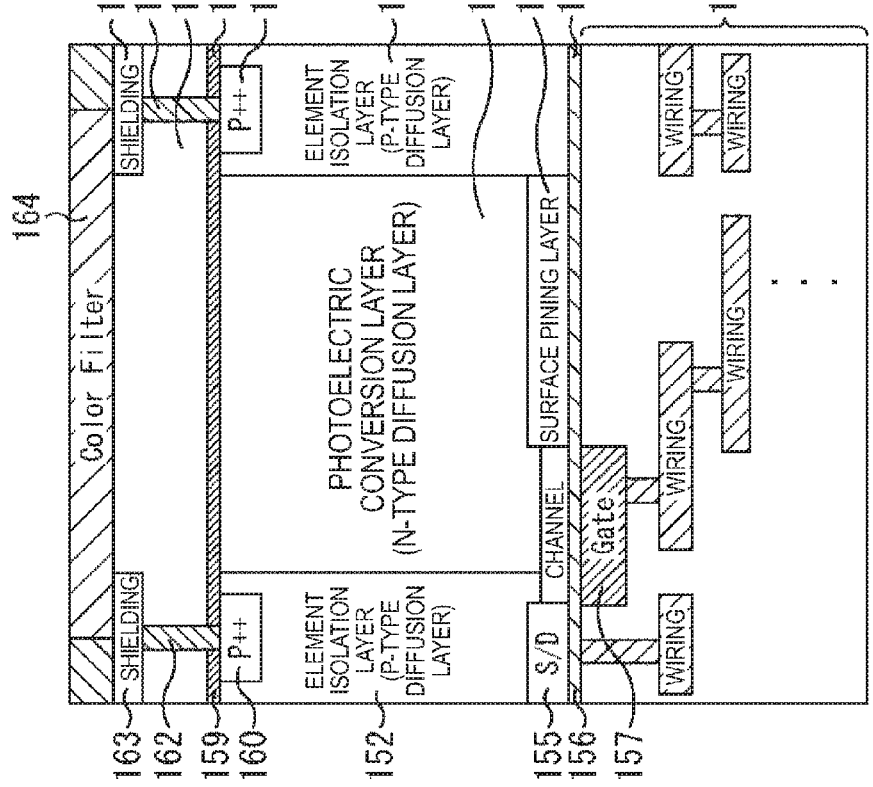

IMAGING APPARATUS MANUFACTURING METHOD AND ELECTRONIC APPARATUS INCLUDING SHIELDING MEMBERS CONNECTED TO HIGH IMPURITY CONCENTRATION REGIONS

CROSS REFERENCE TO RELATED APPLICATIONS

This application is a division of U.S. patent application Ser. No. 14/222,133, filed Mar. 21, 2014, which claims the benefit of Japanese Patent Application No. JP 2013-066635, filed Mar. 27, 2013, the entire disclosures of which are hereby incorporated herein by reference.

BACKGROUND

The present disclosure relates to a solid-state imaging apparatus, a solid-state imaging apparatus manufacturing method and an electronic apparatus, and more specifically to a solid-state imaging apparatus, a solid-state imaging apparatus manufacturing method and an electronic apparatus which can improve the light receiving sensitivity in a rear surface illumination type solid-state imaging apparatus.

There are rear surface illumination type solid-state imaging apparatuses in which light is incident from the rear surface side of a semiconductor substrate. For example, JP 2008-300614A proposes technology, in such a rear surface irradiation type solid-state imaging apparatus, which suppresses the generation of electric charges between active layers surrounding shielding members, by connecting the light incident surface side of the shielding members to a grounded circuit.

SUMMARY

However, since a P-type diffusion layer is formed on the entire interface of the light incident surface side in the technology of JP 2008-300614A, there is a risk that there will be a reduction in sensitivity.

The present disclosure is performed by considering such a situation, and can improve the light receiving sensitivity in a rear surface illumination type solid-state imaging apparatus.

According to a first embodiment of the present technology, there is provided a solid-state imaging apparatus, including a plurality of photoelectric conversion regions which photoelectrically convert light incident from a rear surface side of a semiconductor substrate, element isolation regions formed between the plurality of photoelectric conversion regions arranged in a matrix shape, and shielding members formed on upper surfaces of the element isolation regions. The element isolation regions have high impurity concentration regions of a high impurity concentration connected to at least a part of the shielding members.

According to a second embodiment of the present technology, there is provided a manufacturing method of a solid-state imaging apparatus, including forming a plurality of photoelectric conversion regions which photoelectrically convert light incident from a rear surface side of a semiconductor substrate, forming high impurity concentration regions, on rear surface sides of element isolation regions between the plurality of photoelectric conversion regions arranged in a matrix shape, the high impurity concentration regions having an impurity concentration higher than an impurity concentration of the element isolation regions, and forming shielding members, on upper surfaces of the high impurity concentration regions, connected to the high impurity concentration regions.

According to a second embodiment of the present technology, there is provided an electronic apparatus, including a solid-state imaging apparatus including a plurality of photoelectric conversion regions which photoelectrically convert light incident from a rear surface side of a semiconductor substrate, element isolation regions formed between the plurality of photoelectric conversion regions arranged in a matrix shape, and shielding members formed on upper surfaces of the element isolation regions. The element isolation regions have high impurity concentration regions of a high impurity concentration connected to at least a part of the shielding members.

In the first to third embodiments of the present disclosure, a plurality of photoelectric conversion regions are formed which photoelectrically convert light incident from a rear surface side of a semiconductor substrate, high impurity concentration regions are formed, on rear surface sides of element isolation regions between the plurality of photoelectric conversion regions arranged in a matrix shape, with a higher impurity concentration than that of the element isolation regions, and shielding members are formed, on upper surfaces of the high impurity concentration regions, connected to the high impurity concentration regions.

The solid-state imaging apparatus and electronic apparatus may be independent apparatuses, or may be modules incorporated into another apparatus.

According to the first to third embodiments of the present disclosure, the light receiving sensitivity can be improved in a rear surface illumination type solid-state imaging apparatus.

BRIEF DESCRIPTION OF THE DRAWINGS

FIG. 9 is a figure which describes a second structural example of pixels of a pixel array section;

FIG. 13 is a figure which describes another structural example of pixels of the pixel array section;

FIGS. 17A-B are figures which describe a manufacturing method of a solid-state imaging apparatus applicable to the present disclosure;

FIGS. 19A-B are figures which describe a manufacturing method of a solid-state imaging apparatus applicable to the present disclosure.

DETAILED DESCRIPTION OF THE EMBODIMENT(S)

Figure 1:
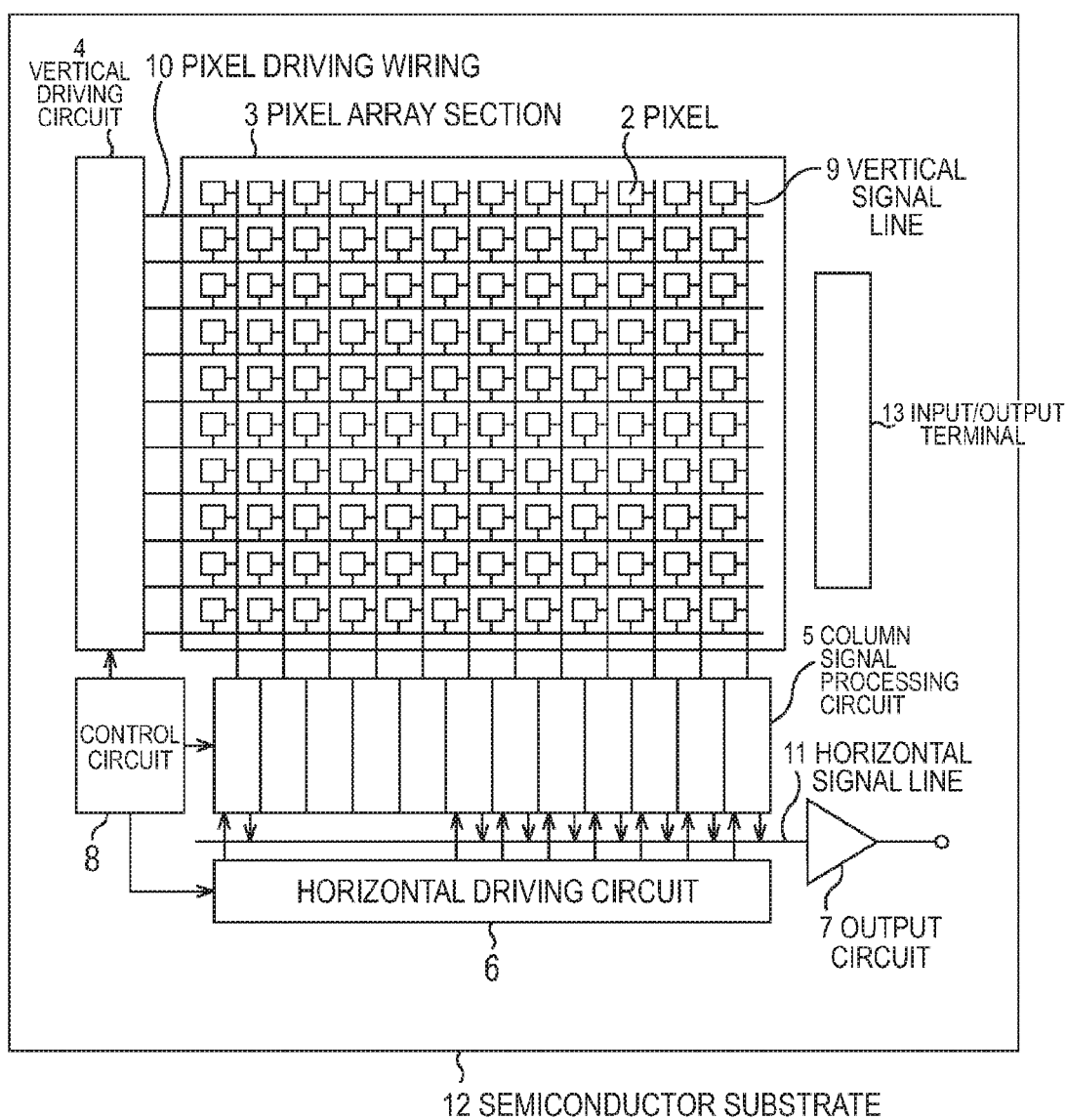
FIG. 1 is a block diagram which shows a schematic configuration of a solid-state imaging apparatus applicable to the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, modes for executing the present disclosure (hereinafter, called embodiments) will be described. A description will be made in the following order.

1. The first embodiment (first cross-section structural example of pixels)

2. The second embodiment (second cross-section structural example of pixels)

3. The third embodiment (third cross-section structural example of pixels)

4. The fourth embodiment (fourth cross-section structural example of pixels)

<Schematic Configuration of the Solid-State Imaging Apparatus>

FIG. 1 shows a schematic configuration of a solid-state imaging apparatus applicable to the present disclosure.

The solid-state imaging apparatus 1 of FIG. 1 is constituted by having a pixel array section 3 on which pixels 2 are arranged in a two-dimensional array shape, and a peripheral circuit section surrounding this pixel array section 3, on a semiconductor substrate 12 using silicone (Si), for example, as a semiconductor. A vertical driving circuit 4, column signal processing circuits 5, a horizontal driving circuit 6, an output circuit 7, and a control circuit 8 are included in the peripheral circuit section.

Each of the pixels 2 includes a photodiode as an photoelectric conversion element and a plurality of pixel transistors. For example, the plurality of pixel transistors is constituted by the four MOS transistors of a transfer transistor, a selection transistor, a reset transistor and an amplification transistor.

Further, the pixels 2 can be set as a pixel sharing structure. This pixel sharing structure is constituted from a plurality of photodiodes, a plurality of transfer transistors, one shared floating diffusion (floating diffusion region), and one shared pixel transistor from each of the other pixel transistors. That is, a shared pixel is constituted by sharing photodiodes and transfer transistors constituting a plurality of unit pixels, and one pixel transistor from each of the other pixel transistors.

The control circuit 8 receives data which specifies an operation mode or the like with an input clock, or outputs data such as internal information of the solid-state imaging apparatus 1. That is, clock signals and control signals, which serve as a basis for the operation of the vertical driving circuit 4, the column signal processing circuits 5, the horizontal driving circuit 6 or the like, are generated by the control circuit 8, based on vertical synchronizing signals, horizontal synchronizing signals and a master clock. Also, the control circuit 8 outputs the generated clock signals and control signals to the vertical driving circuit 4, the column signal processing circuits 5 and the horizontal driving circuit 6.

The vertical driving circuit 4, which is constituted by a shift register, for example, selects a pixel driving wiring 10, supplies a pulse for driving the pixels 2 to the selected pixel driving wiring 10, and drives the pixels 2 by row units. That is, the vertical driving circuit 4 selectively scans each pixel 2 of the pixel array section 3 sequentially in the vertical direction by row units, and supplies pixels signals to the column signal processing circuit 5, based on signal charges generated in accordance with the amount of light received in the photoelectric conversion sections of each pixel 2 through the vertical signal lines 9.

One column signal processing circuit 5 is arranged in each row of the pixels 2, and performs signal processes such as noise reduction of signals generated from the pixels 2 of one row part for each pixel row. For example, the column signal processing circuit 5 performs signal processes such as CDS (Correlated Double Sampling) and AD conversion for removing fixed pattern noise of unique pixels.

The horizontal driving circuit 6, which is constituted by a shift register, for example, sequentially selects each of the column signal processing circuits 5 by sequentially outputting horizontal scanning pulses, and outputs pixel signals from each of the column signal processing circuits 5 to horizontal signal lines 11.

The output circuit 7 performs signal processes to the signals sequentially supplied through the horizontal signal lines 11 from each of the column signal processing circuits 5, and outputs the signals. For example, there are cases where the output circuit 7 only performs buffering, and there are cases where the output circuit 7 performs various digital signal processes, such as black level adjustment and column variation correction. An input/output terminal 13 performs transmission and reception of signals from and to the outside.

The solid-state imaging apparatus 1 constituted such as above is a CMOS image sensor, which is called a column AD system, in which the column signal processing circuits 5 which perform CDS processes and AD conversion processes are arranged in each pixel row.

Further, the solid-state imaging apparatus 1 is a rear surface illumination type MOS type solid-state imaging apparatus in which light is incident from a rear surface side of a side opposite to a front surface side of the semiconductor substrate 12 on which the pixel transistors are formed.

<Example of a Pixel Sharing Structure>

As described above, the pixels 2 of the pixel array section 3 can be made as a structure which has photodiodes and a plurality of pixel transistors in pixel units, or can be made as a pixel sharing structure which has only photodiodes and transfer transistors in pixel units, and shares the other pixel transistors with a plurality of pixels.

Figure 2:
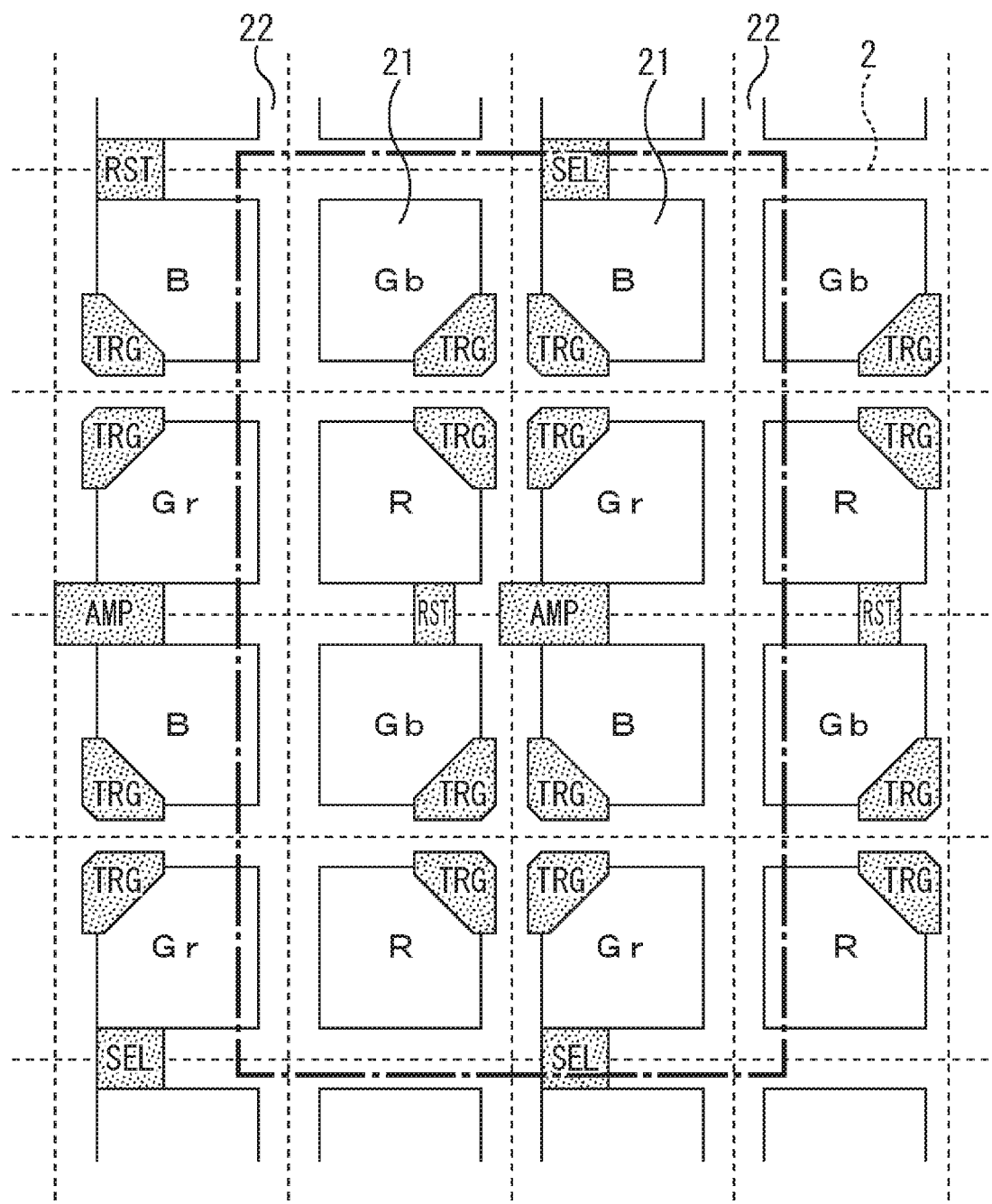
FIG. 2 is a figure which shows an example of a pixel sharing structure.

In the present embodiment, the pixels 2 of the pixel array section 3 have a pixel sharing structure such as shown in FIG. 2.

That is, FIG. 2 shows a pixel sharing structure adopted by the solid-state imaging apparatus 1 of FIG. 1.

In the pixel array section 3, the plurality of pixels 2 regularly arranged in a two-dimensional array shape are repeatedly arranged, in the horizontal direction and the vertical direction, with 4 pixels of 2×2 constituted of Gb pixels and Gr pixels which receive green (Gr, Gb) light, R pixels which receive red (R) light, and B pixels which receive blue (B) light, which is a so-called Bayer arrangement.

The pixel sharing structure of the present embodiment is a structure in which a plurality of pixel transistors, from 2 pixels in the horizontal direction and 4 pixels in the vertical direction for a total of 8 pixels, represented by the dashed line in FIG. 2, are shared from among of the plurality of Bayer arranged pixels 2.

Specifically, for the 8 pixels of the shared unit represented by the dashed line, a reset transistor RST, an amplification transistor AMP and a selection transistor SEL are shared, and transfer transistors TRG are arranged for each of the pixels 2. Note that, only the gate electrodes of each of the reset transistors RST, amplification transistors AMP, selection transistors SEL and transfer transistors TRG are illustrated in FIG. 2.

Each pixel 2 has a structure in which photoelectric conversion regions 21, which photoelectrically convert light incident from the rear surface side of the semiconductor substrate 12, are isolated by element isolation regions 22.

<First Cross-Section Structural Example of Pixels>

Next, a first structural example of the pixels 2 of the pixel array section 3 will be described by referring to FIG. 3.

Figure 3:
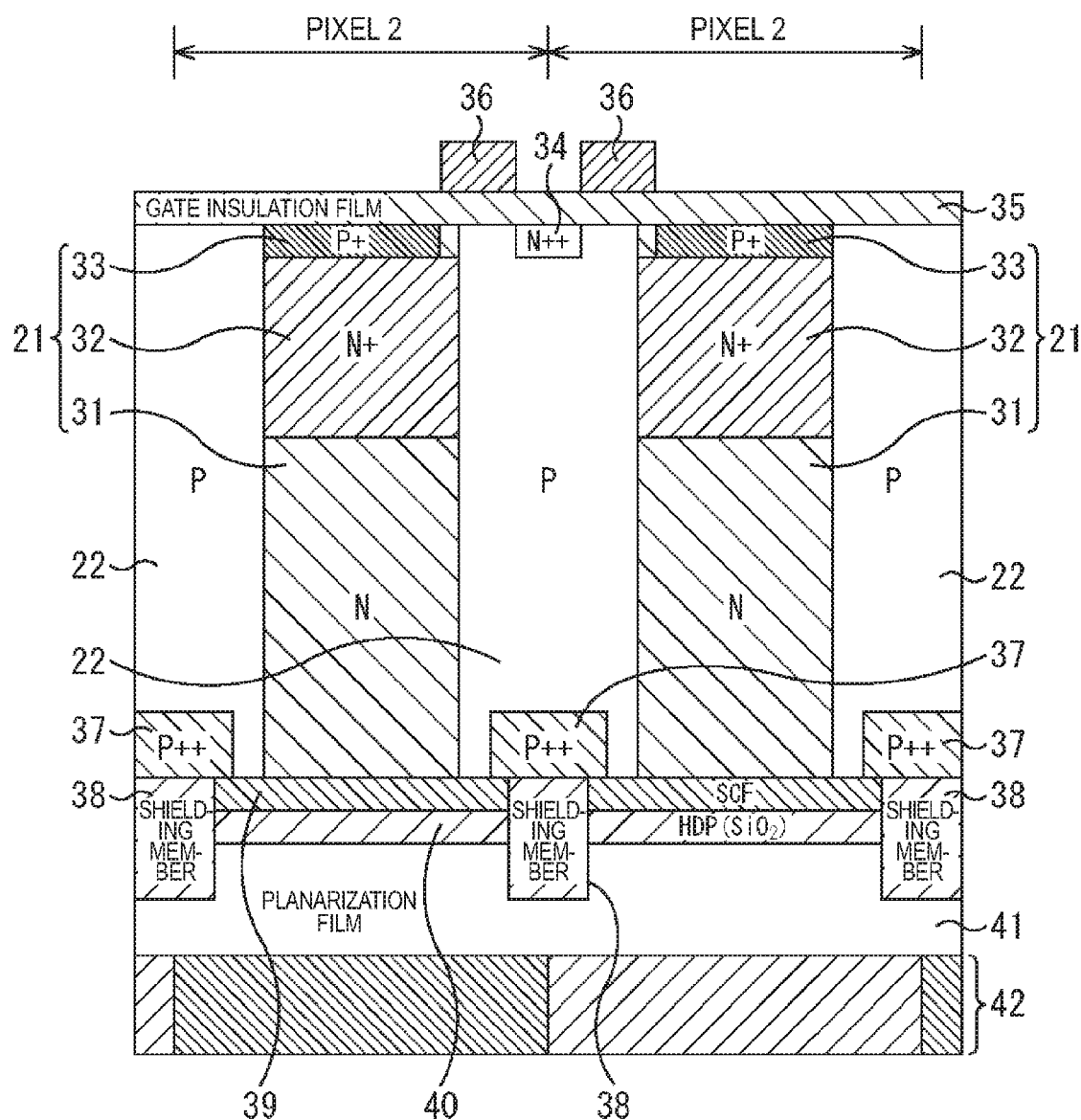
FIG. 3 is a figure which describes a first structural example of pixels of a pixel array section.

FIG. 3 shows a cross-sectional view of two pixels arranged in the horizontal direction within the shared unit of FIG. 2.

Note that, the lower side of the figure in FIG. 3 is the rear surface side of the semiconductor substrate 12 on which light is incident, and the upper side of the figure in FIG. 3 corresponds to the front surface side of the semiconductor substrate 12 on which wiring layers are formed.

Photodiodes (PD) are formed, by layering N-type semiconductor regions 31, N-type semiconductor regions (N+ semiconductor regions) 32 with a higher impurity than the N-type semiconductor regions 31, and high impurity concentration P-type semiconductor regions (P+ semiconductor regions) 33, in the photoelectric conversion regions 21 within the pixels 2.

Therefore, since P-type impurity regions are not arranged on the light incident side (lower side of the figure) of the photodiodes (PD), the solid-state imaging apparatus 1 can improve the light receiving sensitivity compared to the case where P-type impurity regions are arranged.

The element isolation regions 22 on both sides of the photoelectric conversion regions 21 are formed in a P-type semiconductor region (P-Well).

High impurity concentration N-type semiconductor regions (N++ semiconductor regions) 34, which become floating diffusion regions used in common by a plurality of the pixels 2 of a shared unit, are formed on the substrate front surface side of each element isolation region 22 positioned between two pixels 2 arranged in the horizontal direction. Here, "N++" of the N++ semiconductor regions 34 represents, for example, that the impurity concentration is higher than that of "N+" of the N+ semiconductor regions 32.

The gate electrodes 36 of the transfer transistors TRG are formed on the upper surfaces of the photoelectric conversion regions 21 and the element isolation regions 22 (the surface of the substrate front surface side), via a gate insulation film 35.

On the other hand, P++ semiconductor regions 37, in which the impurity concentration is set to a higher concentration than that of the P-type semiconductor regions of all the element isolation regions 22, are formed near the interfaces of each of the element isolation regions 22 on the substrate rear surface side. These high impurity concentration P++ semiconductor regions 37 function as contact sections with conductive shielding members 38 to which a voltage of 0 [V] is supplied, such as those described later. The P++ semiconductor regions 37 are arranged separated from the N-type semiconductor regions 31 of the photoelectric conversion regions 21, in order to avoid concerns such as a reduction in sensitivity and a deterioration in color mixing.

The shielding members 38 are formed, on the lower surfaces of each of the P++ semiconductor regions 37, in order to prevent light being incident which passes through a color filter 42 of other adjacent pixels 2. Therefore, the surfaces of the shielding members 38 connecting with the element isolation regions 22 are covered by the P++ semiconductor regions 37 which are set with a high impurity concentration. For example, conductive members which have a light shielding property such as tungsten (W) are used in the shielding members 38.

For example, a fixed charge film (SCF) 39 formed by a hafnium oxide film or the like, and a silicon oxide film (SiO2) 40, are formed by a high density plasma CVD, for example, on the regions of the substrate rear surface side where the shielding members 38 are not formed. The silicon oxide film (SiO2) is called a HDP (High Density Plasma) oxide film.

Also, the entire surface of the shielding members 38 and the silicon oxide film 40 is covered with a planarization film 41, and a color filter 42 of one of green (Gr, Gb), red (R) and blue (B) is also formed.

Note that, while an illustration has been omitted in FIG. 3, an on-chip lens 143 (FIG. 14) is additionally formed on the lower side of the color filter 42.

As described above, in the pixel array section 3 of the solid-state imaging apparatus 1, the conductive shielding members 38 are arranged directly below the element isolation regions 22 which isolate the photodiodes of each pixel 2. Also, the conductive shielding members 38 are connected to the P++ semiconductor regions 37, which are regions adjusted to a higher impurity concentration, within the element isolation regions 22.

In other words, each of the element isolation regions 22 between the plurality of photoelectric conversion regions 22 of the pixel array section 3 have high impurity concentration P++ semiconductor regions 37, and the P++ semiconductor regions 37 are directly connected to the shielding members 38.

<Planar Arrangement of the Shielding Members 38>

Figure 4:
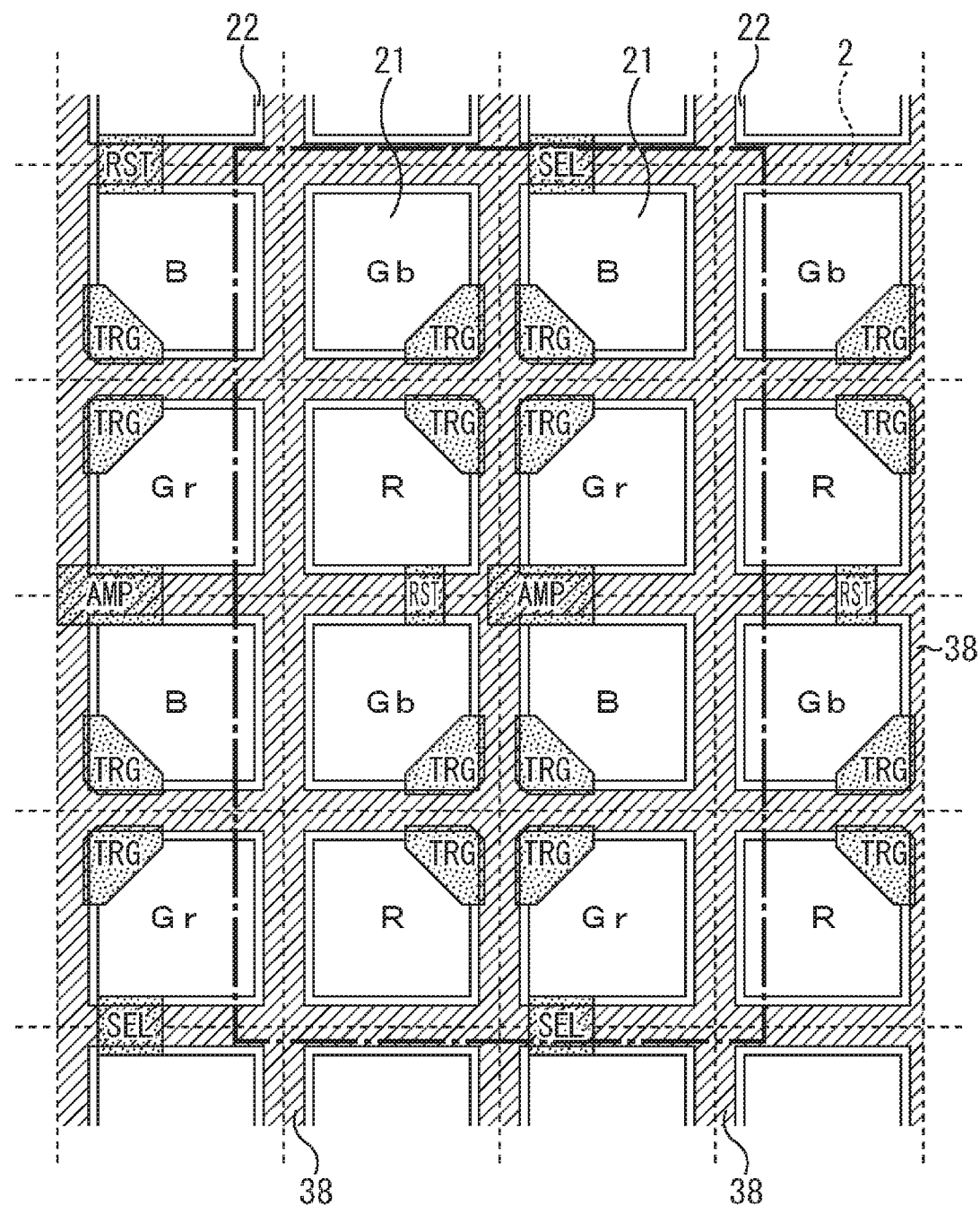
FIG. 4 is a plan view which shows a region on which shielding members are formed.

FIG. 4 is a plan view of the pixel array section 3 which shows a region in which the shielding members 38 are formed.

As shown in FIG. 4, the shielding members 38 represented by attached diagonal lines are formed in a lattice shape, similar to that of the element isolation regions 22, directly under the element isolation regions 22.

<Planar Figure of the Pixel Array Section 3>

Figure 5:
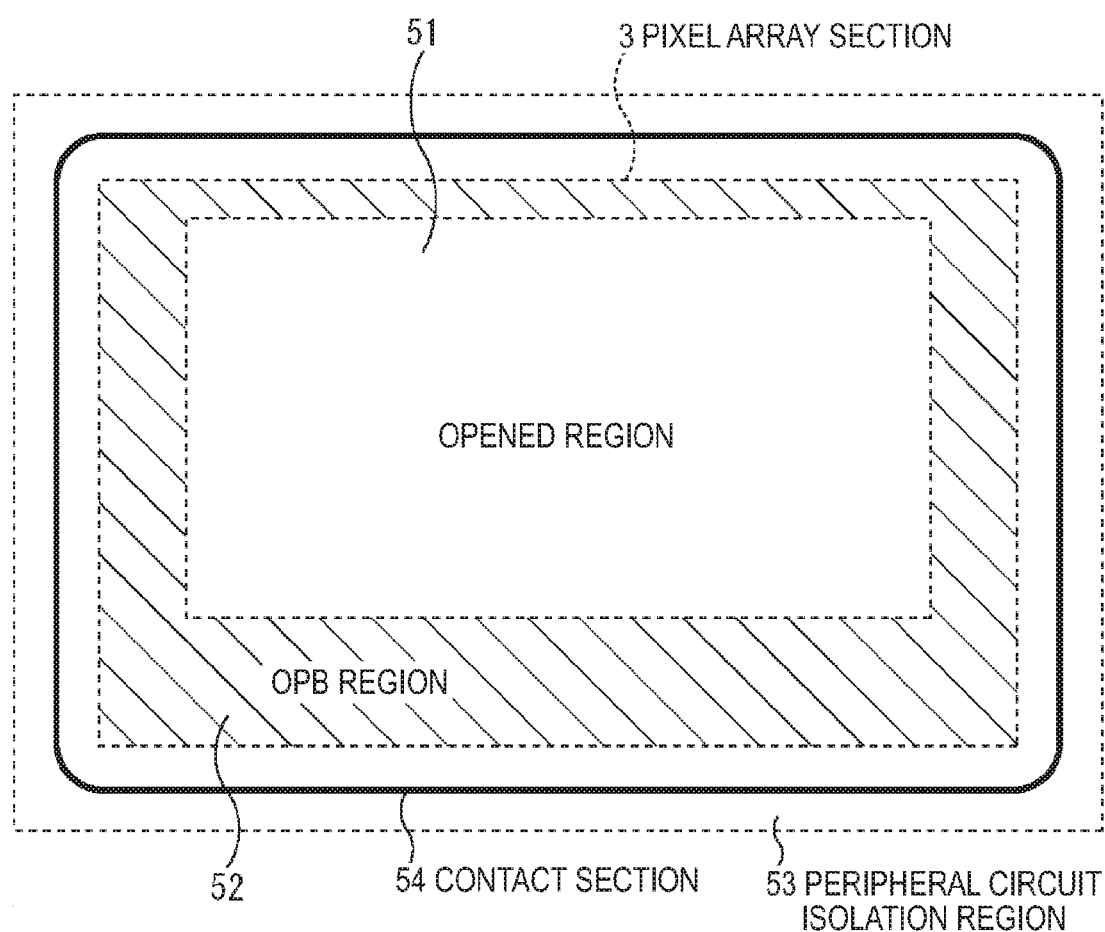
FIG. 5 is a plan view of the pixel array section.

FIG. 5 shows a plan view of the pixel array section 3 of the solid-state imaging apparatus 1.

The pixel array section 3 includes an opened region 51 at which the photoelectric conversion regions 21 of each pixel 2 are opened, and an OPB (Optical Black) region 52 which is a region where the photoelectric conversion regions 21 are shielded with the element isolation regions 22, and where an optical black level is detected.

A peripheral circuit isolation region 53 is formed surrounding the pixel array section 3. The peripheral circuit isolation region 53 is a region for isolating the pixel array section 3 from the peripheral circuit in which the vertical driving circuit 4, the column signal processing circuit 5 or the like are arranged.

The shielding members 38 arranged in a lattice shape in the pixel array section 3, such as shown in FIG. 4, are formed so as to reach the peripheral circuit isolation region 53 surrounding the pixel array section 3, and are connected to a P-type semiconductor region 60 (FIG. 6) of the semiconductor substrate 12 in a contact section 54 of the peripheral circuit isolation region 53.

<Cross-Section Structural View of the Surroundings of the Pixel Array Section 3>

Figure 6:
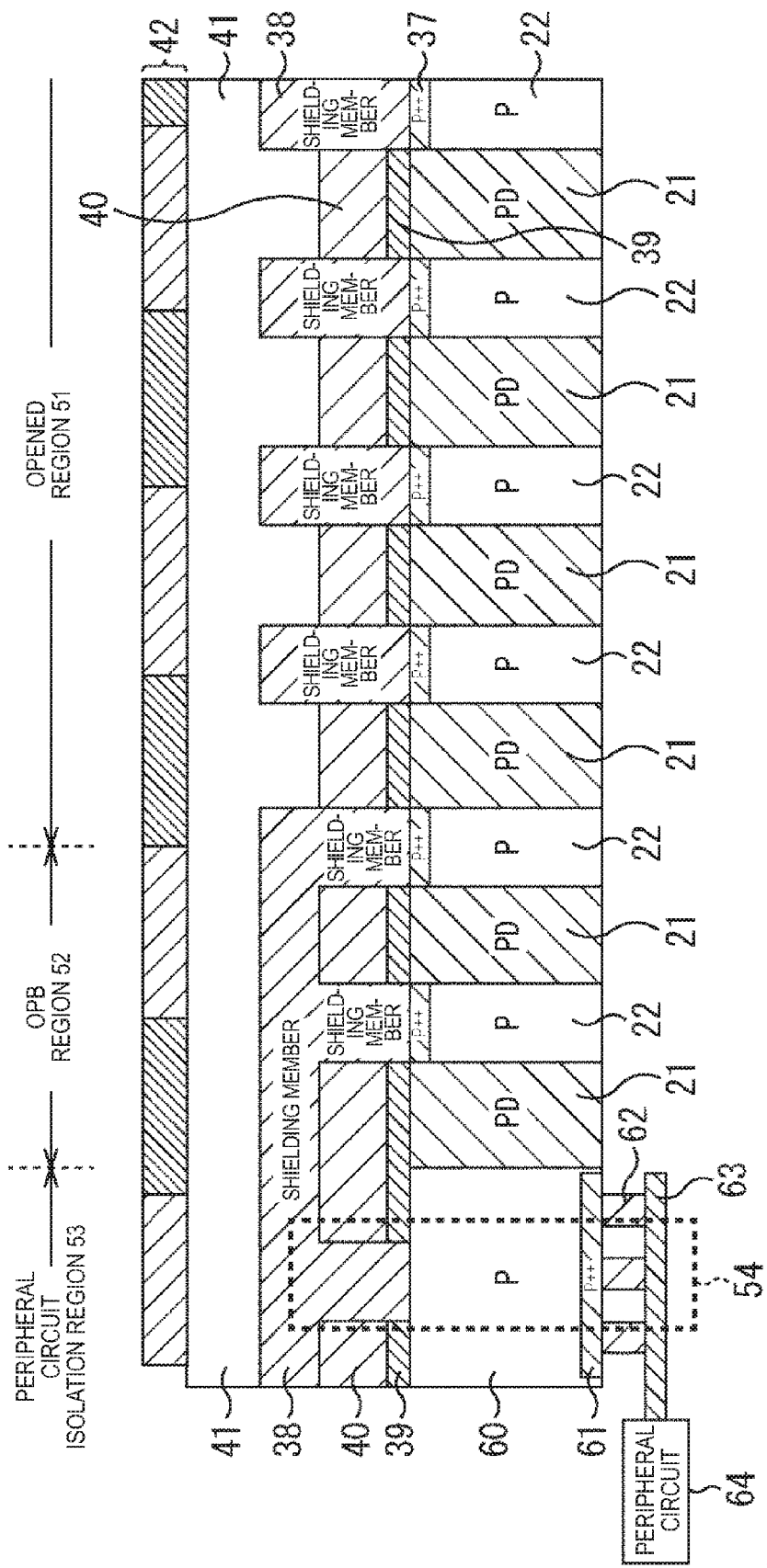
FIG. 6 is a cross-section structural view near the boundary between a peripheral circuit isolation region and the pixel array section.

FIG. 6 shows a cross-section structural view near the interface between the peripheral circuit isolation region 53 and the pixel array section 3.

Note that, the same reference numerals are attached to parts in FIG. 6 the same as those of FIG. 3, and a description of these parts will be arbitrarily omitted. The up and down direction in FIG. 6 is illustrated opposite to that of FIG. 3, with the figure upper side becoming the substrate rear surface side (light incident surface side) and the figure lower side becoming the substrate front surface side. Further, by considering the visibility of the entire figure, there are parts of FIG. 3 which have been simplified in FIG. 6, and are shown changed on a reduced scale.

The shielding members 38 are formed in a lattice shape similar to that of the element isolation regions 22, such as described by referring to FIG. 4, in the opened region 51. On the other hand, since it may also be necessary to shield the photoelectric conversion regions 21, on which the photodiodes (PD) are formed, in the OPB region 52, the shielding members 38 are formed on the upper surfaces of the photoelectric conversion regions 21. That is, the entire OPB region 52 is covered by the shielding members 38.

The shielding members 38 formed on the entire OPB region 52 are similarly formed on the peripheral circuit isolation region 53, and are connected to the P-type semiconductor region (P-Well) of the peripheral circuit isolation region 53. The contact section 54 of the peripheral circuit isolation region 53 corresponds to the region at which the P-type semiconductor region 60 is connected to the shielding members 38.

A P++ semiconductor region 61, in which the impurity concentration is set to a high concentration, is formed near the interface of the substrate front surface side of the P-type semiconductor region 60 of the peripheral circuit isolation region 53, and is connected to connection conductors 62 of the wiring layers of the substrate front surface side. These connection conductors 62 are connected to a first wiring layer 63, which is connected to the peripheral circuit 64.

For example, a voltage of 0 [V] is supplied to the P-type semiconductor region 60 of the peripheral circuit isolation region 53 from the peripheral circuit 64, via the first wiring layer 63 and the connection conductors 62. In other words, the P-type semiconductor region 60 is connected to the first wiring layer 63, which is a grounded wiring (GND) of the peripheral circuit 64.

The shielding members 38 are electrically connected to the P-type semiconductor region 60 by the contact section 54. Further, the shielding members 38 are also connected to the high impurity concentration P++ semiconductor regions 37 within the element isolation regions 22 of the pixel array section 3.

Therefore, the element isolation regions 22, which isolate the photoelectric conversion regions (PD) 21 of each pixel 2, are electrically connected to the first wiring layer 63, which is a grounded wiring (GND) of the peripheral circuit 64, and a predetermined voltage (0 [V]) is supplied to the element isolation regions 22 from the peripheral circuit 64.

In this way, in the solid-state imaging apparatus 1 applicable to the present disclosure, the element isolation regions 22, which isolate the photoelectric conversion regions (PD) 21 of each pixel 2, are electrically connected to the grounded wiring (GND) of the peripheral circuit 64, from the substrate rear surface side, via the shielding members 38. In this way, since the voltage is controlled to 0 [V], the element isolation regions 22 can prevent output within the screen from having shading, by a phenomenon such as well fluctuation in which the electrical potential of the element isolation regions 22 changes by following a change of an applied voltage, which is applied to the gate electrodes of the pixel transistors.

Note that, while a voltage of 0 [V] is supplied to the element isolation regions 22 in the example described above, a negative voltage of approximately −1 [V] may be applied, for example.

<Cross-Section Structural View of the Related Art>

Figure 7:
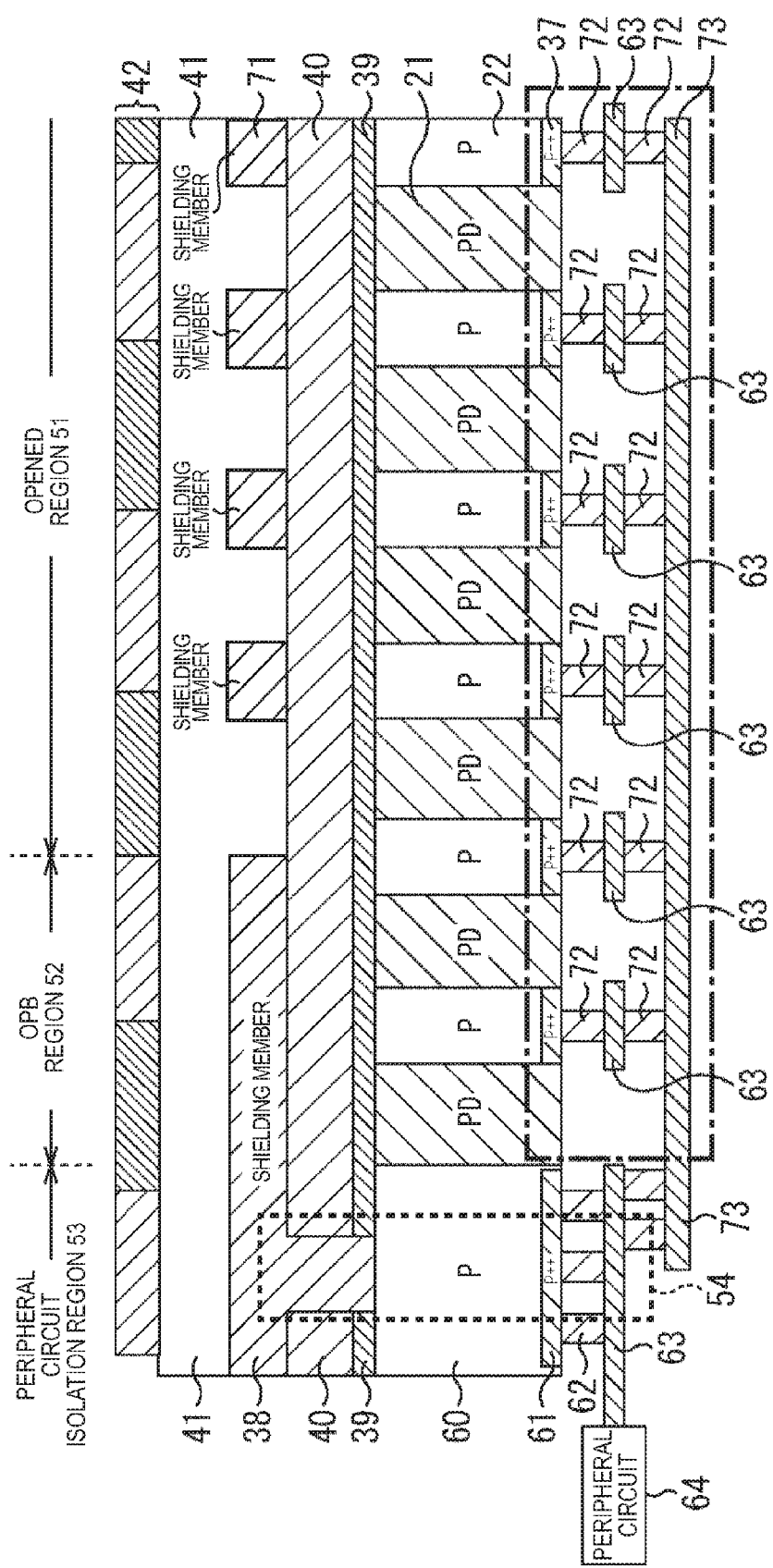
FIG. 7 is a cross-section structural view near the boundary of the pixel array section of the related art.

FIG. 7 shows a cross-section structural view near the pixel array section interface of the related art, in order to describe the effect of the present disclosure.

The same reference numerals are attached to parts in FIG. 7 corresponding to those of FIG. 6, and only the different parts will be described.

In the structure of the related art shown in FIG. 7, shielding members 71 are not connected to the element isolation regions 22, and the element isolation regions 22 are electrically connected to the first wiring layer 63, which is a grounded wiring (GND) of the peripheral circuit 64, from the substrate front surface side.

Specifically, the high impurity concentration P++ semiconductor regions 37 are included near the interface of the substrate front surface side of the element isolation regions 22, and are connected to connection conductors 72. The connection conductors 72 are connected to a second wiring layer 73 via the first wiring layer 63 within the pixel array section 3, and the second wiring layer 73 is connected to the peripheral circuit 64, via the first wiring layer 63, in the peripheral circuit isolation region 53. In this way, a voltage of 0 [V] from the peripheral circuit 64 is supplied to the element isolation regions 22.

In such a structure of the related art, wiring layers (such as the connection conductors 72 and the second wiring layer 73) for connecting the element isolation regions 22 and the grounded wiring (GND) of the peripheral circuit 64 may be necessary on the substrate front surface side, such as shown by the rectangular dashed line in FIG. 7.

On the other hand, in the solid-state imaging apparatus 1 applicable to the present disclosure, since there is an electrical connection to the grounded wiring via the shielding members 38 from the substrate rear surface side, such as shown in FIG. 6, it may be unnecessary to have wiring layers of the substrate front surface side for grounding the element isolation regions 22. In this way, the degree of freedom of the wiring layout of the substrate front surface side can be improved.

<Another Example of the Contact Section>

Figure 8:
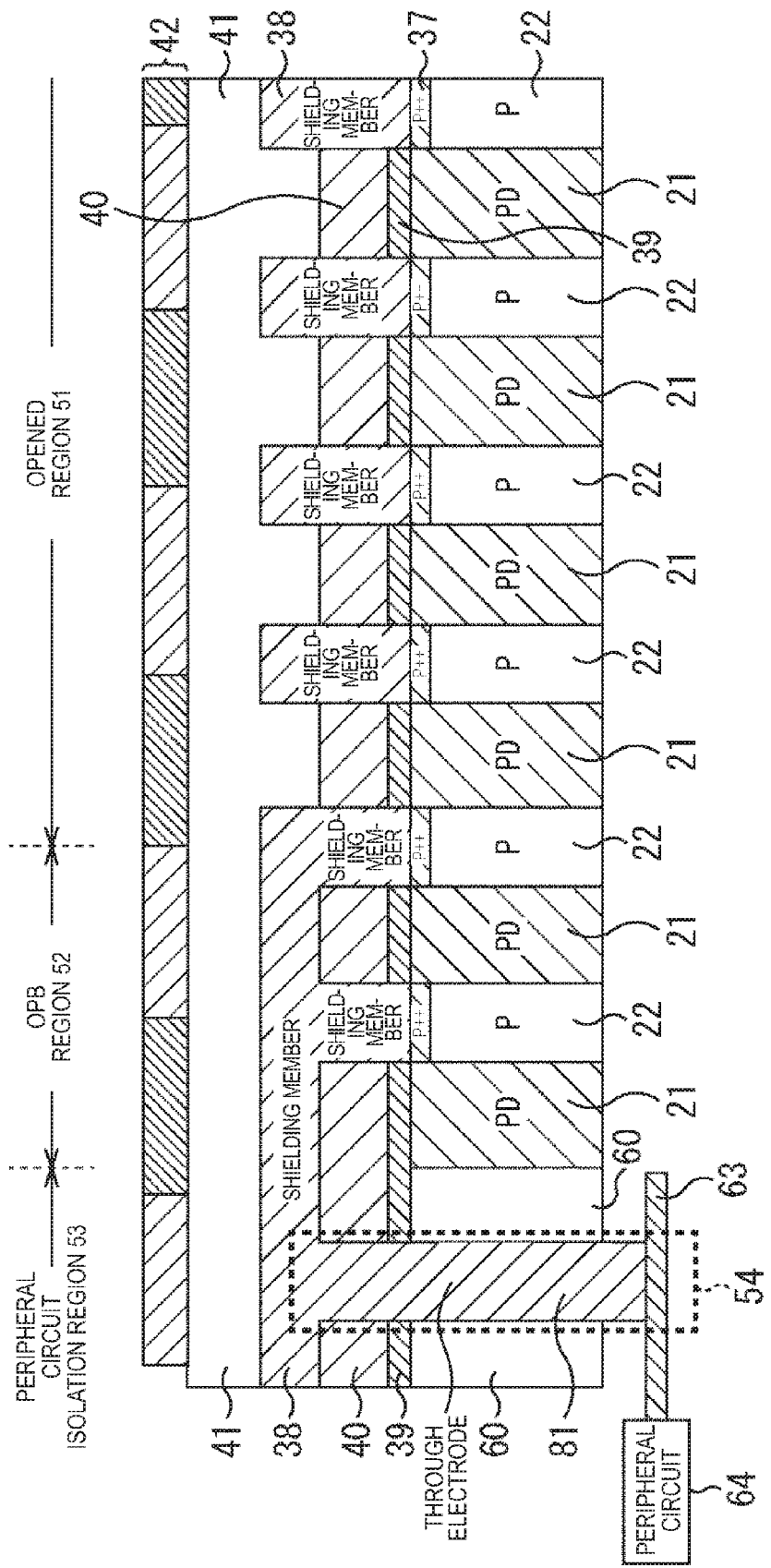
FIG. 8 is a figure which shows another structural example of a contact section.

FIG. 8 is a figure which shows another structural example of the contact section 54 of the peripheral circuit isolation region 53.

In the example of FIG. 8, the contact section 54 of the peripheral circuit isolation region 53 is a structure directly connected to the first wiring layer 63 by a through electrode 81 using a material the same as that of the shielding members 38. By such a through electrode 81, a voltage of 0 [V] may be supplied from the peripheral circuit 64 to the shielding members 38, and additionally supplied from the shielding members 38 to the element isolation regions 22.

<Second Cross-Section Structural Example of Pixels>

Next, a second structural example of the pixels 2 of the pixel array section 3 will be described by referring to FIG. 9.

FIG. 9 is a cross-sectional figure of the pixels 2 shown similar to that of the first structural example of FIG. 3.

The same reference numerals are attached to parts in FIG. 9 the same as those of FIG. 3, a description of these parts will be arbitrarily omitted, and only the different parts will be described. This will be the same from FIG. 10 onwards.

In the second structural example of the pixels 2, two types of shielding members, shielding members 91A and shielding members 91B, are present as shielding members 91. The shielding members 91A are connected to the high impurity concentration P++ semiconductor regions 37 of the element isolation regions 22, similar to FIG. 3. On the other hand, the shielding members 91B are not connected to the element isolation regions 22, and the P++ semiconductor regions 37 are not present in the element isolation regions 22.

That is, in the above described first structural example, all of the shielding members 38 arranged in a lattice shape within the pixel array section 3 are connected to the P++ semiconductor regions 37 of the element isolation regions 22.

On the other hand, in the second structural example, only the part of the shielding members 91A, from among all the shielding members 91 arranged in a lattice shape within the pixel array section 3, are connected to the P++ semiconductor regions 37 of the element isolation regions 22. The P++ semiconductor regions 37 function as contact sections with the conductive shielding members 91A.

A fixed charge film 39 and a silicon oxide film 40 are formed, similar to the photoelectric conversion regions 21, between the element isolation regions 22 and the shielding members 91B which are not connected to the P++ semiconductor regions 37.

In the second structural example, such as described above, only the part of the shielding members 91A within the pixel array section 3 are connected to (the P++ semiconductor regions 37 of) the element isolation regions 22, and are grounded.

FIG. 10 is a figure which shows an arrangement example of the connection locations in the case where the shielding members 91A contact with only a part of the element isolation regions 22.

In the case where the shielding members 91A contact with only a part of the element isolation regions 22, there will be a condition in which there is contact with at least one or more locations within a region of 8 pixels, which is a shared unit.

Figure 10A:
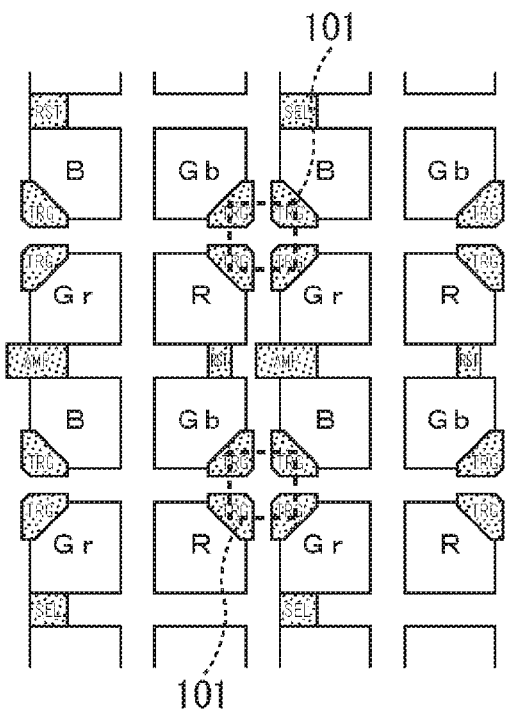
FIGS. 10A-C are figures which describe an arrangement location of the shielding members.

FIG. 10A shows an example in which there is contact (the shielding members 91A are arranged), at regions 101 directly under the floating diffusion, within the element isolation regions 22 of the shared units, such as shown in FIG. 9.

Figure 10B:
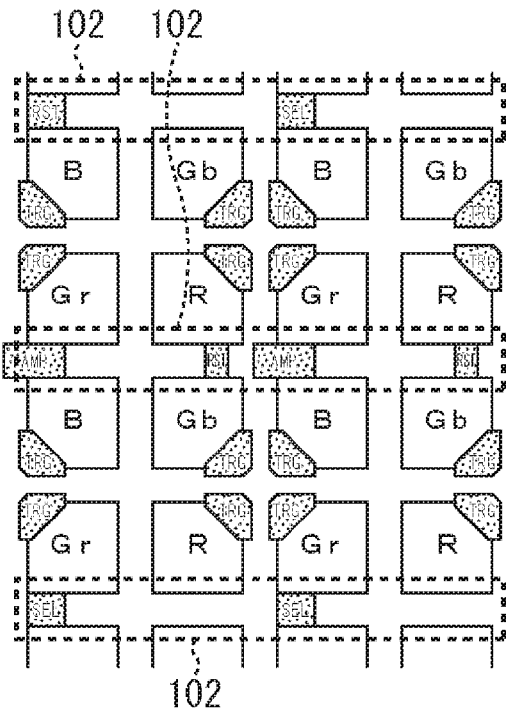

FIG. 10B shows an example in which there is contact (the shielding members 91A are arranged), at regions 102 directly under the shared pixel transistors, within the element isolation regions 22 of the shared units.

Figure 10C:
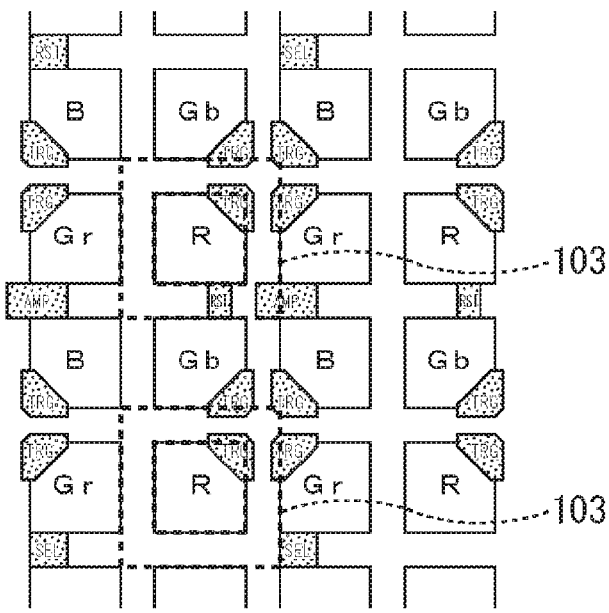

FIG. 10C shows an example in which there is contact (the shielding members 91A are arranged), at regions 103 surrounding the red (R) pixels 2, within the element isolation regions 22 of the shared units. Red light is light with the longest wavelength out of red (R), green (G) and blue (B). Since light with a long wavelength is photoelectrically converted at a position deep within the photoelectric conversion regions 21 (a position far from the incident surface of light), it will be difficult for the light to be affected by the P++ semiconductor regions 37. Accordingly, the shielding members 91A are arranged only at the regions 103 surrounding the red (R) pixels 2, with have the longest wavelength out of red (R), green (G) and blue (B).

Note that, the examples of FIG. 10A to FIG. 10C are examples in which there is contact with at least one or more locations within a region of 8 pixels, which is a shared unit, and it is needless to say that there may be contact at locations other than these.

By having the shielding members 91A contact with the element isolation regions 22 in at least one or more locations within a region of 8 pixels, which is a shared unit, output within the screen can be prevented from having shading, by a phenomenon such as well fluctuation in which the electrical potential of the element isolation regions 22 changes by following a change of an applied voltage, which is applied to the gate electrodes of the pixel transistors.

<Third Cross-Section Structural Example of Pixels>

Next, a third structural example of the pixels 2 of the pixel array section 3 will be described by referring to FIG. 11.

Figure 11:
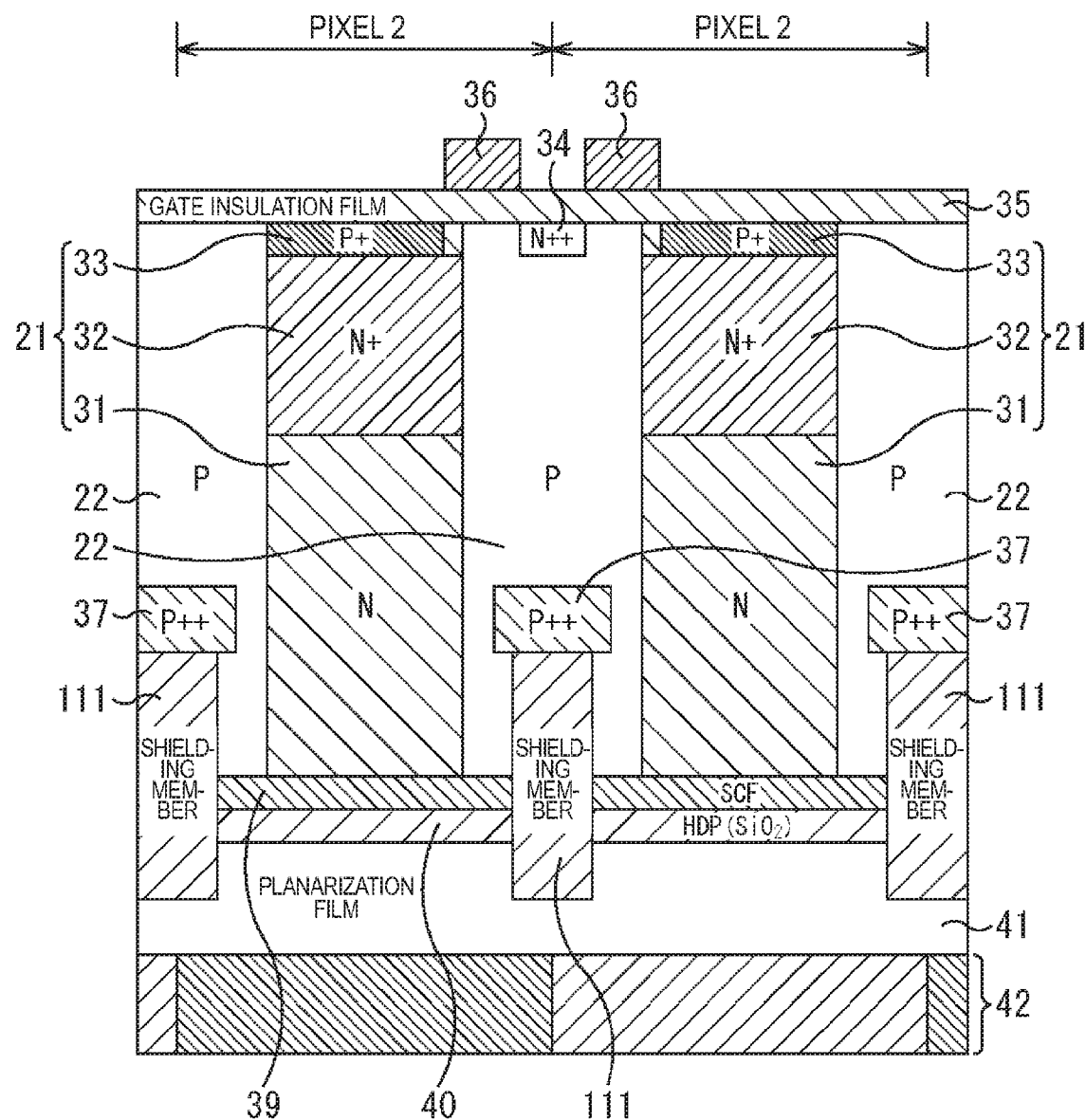
FIG. 11 is a figure which describes a third structural example of pixels of a pixel array section.

FIG. 11 is a cross-sectional figure of the pixels 2 shown similar to that of the first structural example of FIG. 3.

In the third structural example of the pixels 2, the P++ semiconductor regions 37 are not near the interfaces between the element isolation regions 22 and the fixed charge film 39, and are formed inside the element isolation regions 22 separated from the fixed charge film 39.

Also, shielding members 111 are formed embedded inside the element isolation regions 22 so as to connect to the P++ semiconductor regions 37. In this way, since the N-type semiconductor regions 31 of adjacent photoelectric conversion regions 21 can be physically isolated by the shielding members 111, the effect of suppressing color mixing will be improved.

Further, since the outside of the shielding members 111 can be covered by the element isolation regions 22, which are P-type semiconductor regions, the effect of suppressing dark current will increase.

<Fourth Cross-Section Structural Example of Pixels>

Next, a fourth structural example of the pixels 2 of the pixel array section 3 will be described by referring to FIG. 12.

Figure 12:
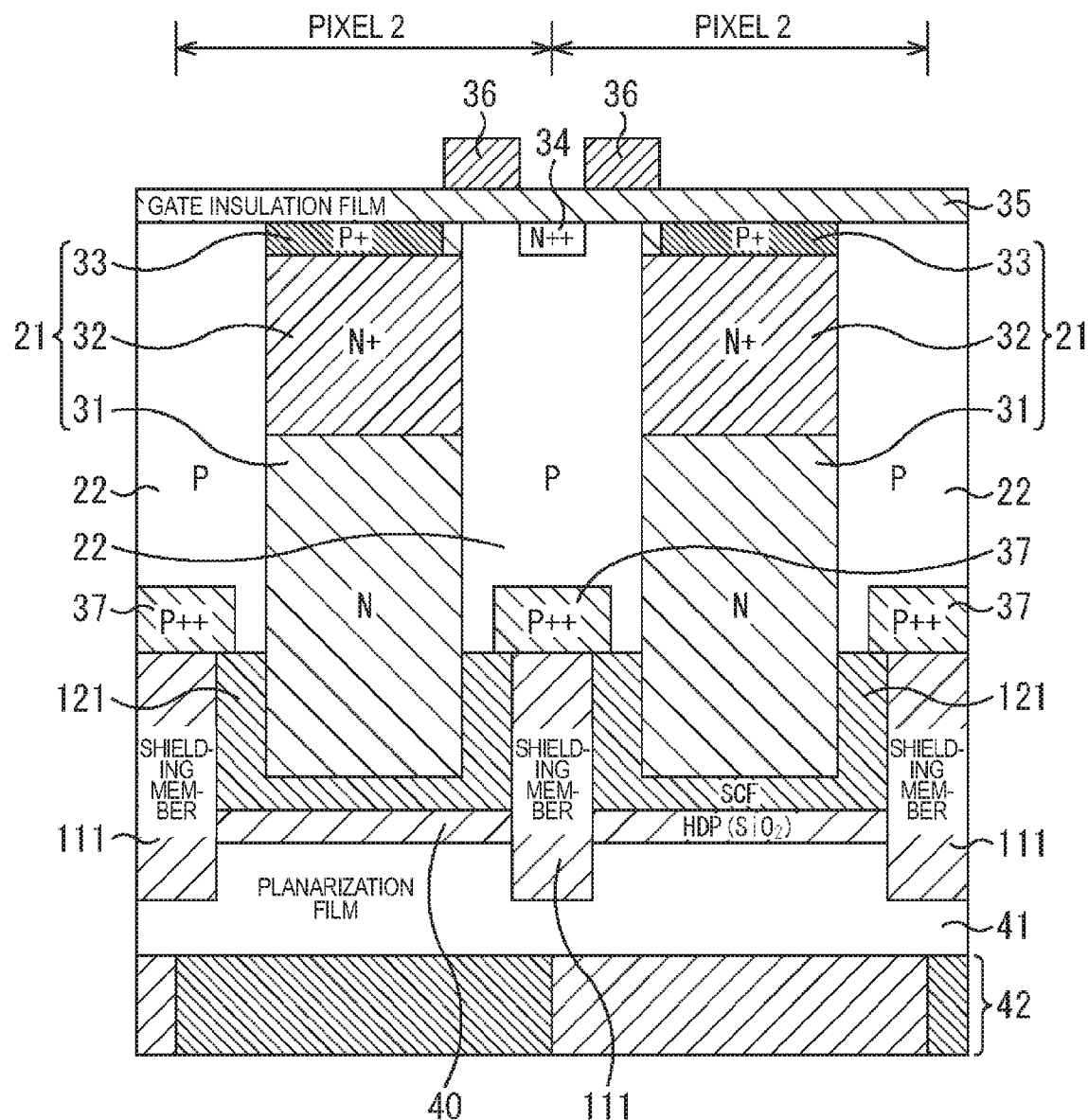
FIG. 12 is a figure which describes a fourth structural example of pixels of a pixel array section.

FIG. 12 is a cross-sectional figure of the pixels 2 shown similar to that of the first structural example of FIG. 3.

In the fourth structural example of the pixels 2, the shielding members 111 are formed embedded similar to that of the above described third structural example. In this way, since the N-type semiconductor regions 31 of adjacent photoelectric conversion regions 21 can be physically isolated by the shielding members 111, the effect of suppressing color mixing will be improved.

Also, the regions between the shielding members 111 and the N-type semiconductor regions 31 are formed by the fixed charge film 121. In this way, since the outside of the shielding members 111 can be covered by the fixed charge film 121, the effect of suppressing dark current will increase.

Note that, while the third and fourth structural examples shown in FIG. 11 and FIG. 12 are examples in which there is contact directly under all the element isolation regions 22, similar to the above described first structural example, there may be contact with only one part, such as in the above described second structural example.

Note that, in the above described example, the shielding members 38 are formed so as to directly contact with the high impurity concentration P++ semiconductor regions 37. However, as shown in FIG. 13, contact sections 141 which connect to the P++ semiconductor regions 37 are formed by using a conductive material different to that of the shielding members 38, and by forming the shielding members 38 above the contact sections 141, the P++ semiconductor regions 37 and the shielding members 38 may also be indirectly connected.

<Manufacturing Method of the Solid-State Imaging Apparatus>

Next, a manufacturing method of the solid-state imaging apparatus 1 will be described by referring to FIG. 14 to FIG. 19.

Figure 14A:
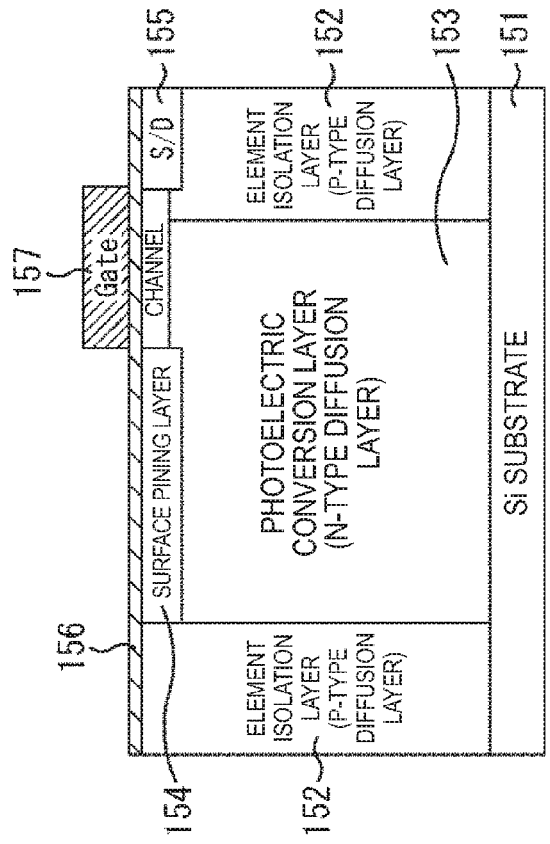
FIGS. 14A-B are figures which describe a manufacturing method of a solid-state imaging apparatus applicable to the present disclosure.

First of all, as shown in FIG. 14A, a semiconductor substrate 151 using silicon (Si), for example, is prepared as a semiconductor.

Figure 14B:
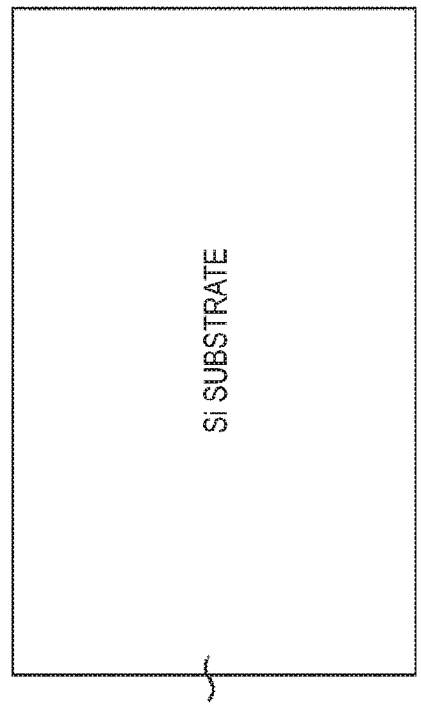

Next, as shown in FIG. 14B, P-type diffusion layers 152 which are element isolation layers, N-type diffusion layers 153 which are photoelectric conversion layers, and surface pining layers 154 are formed in the semiconductor substrate 151. Afterwards, source/drain regions 155 of pixel transistors, a gate insulation film 156 and gate electrodes 157 are formed on the front surface side of the semiconductor substrate 151.

For example, the P-type diffusion layers 152 correspond to the element isolation regions 22 of FIG. 13, the N-type diffusion layers 153 correspond to the N-type semiconductor regions 31 and the N+ semiconductor regions 32 of FIG. 13, and the surface pining layers 154 correspond to the P+ semiconductor regions 33 of FIG. 13. For example, the gate insulation film 156 and the gate electrodes 157 correspond to the gate insulation film 35 and the gate electrodes 36 of FIG. 13.

Figure 15A:
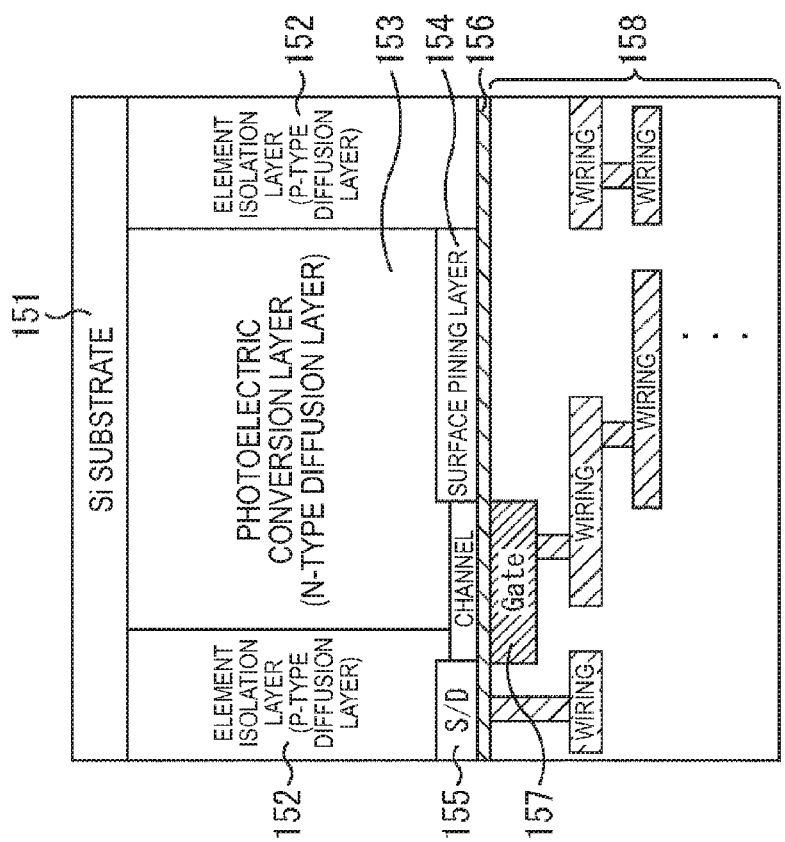
FIGS. 15A-B are figures which describe a manufacturing method of a solid-state imaging apparatus applicable to the present disclosure.
Figure 15B:
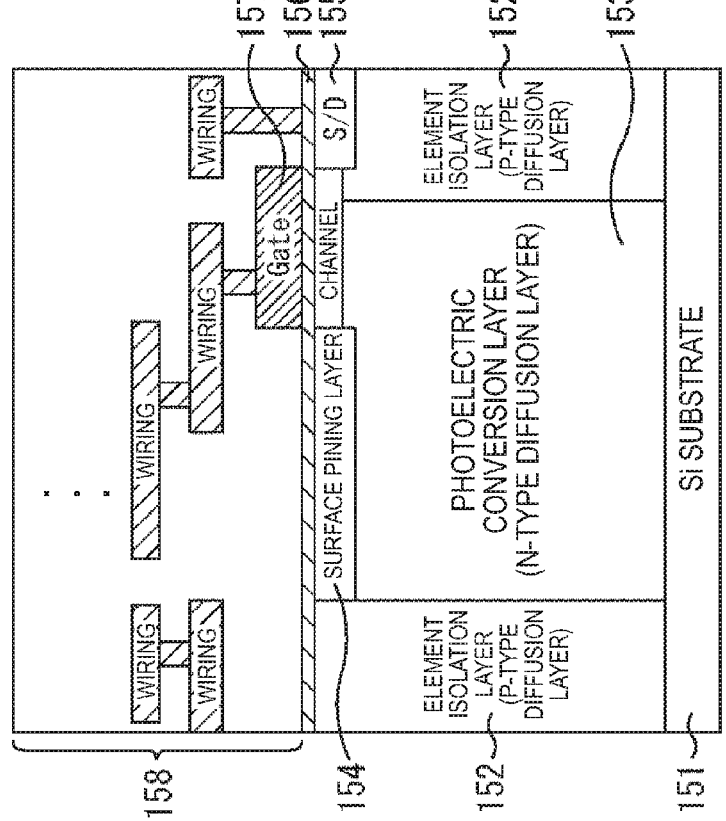

Next, as shown in FIG. 15A, a wiring layer 158 constituting a plural amount of metallic wiring and interlayer dielectrics, is formed on the front surface side of the semiconductor substrate 151, and afterwards, as shown in FIG. 15B, the entire semiconductor substrate 151 is inverted.

Figure 16A:
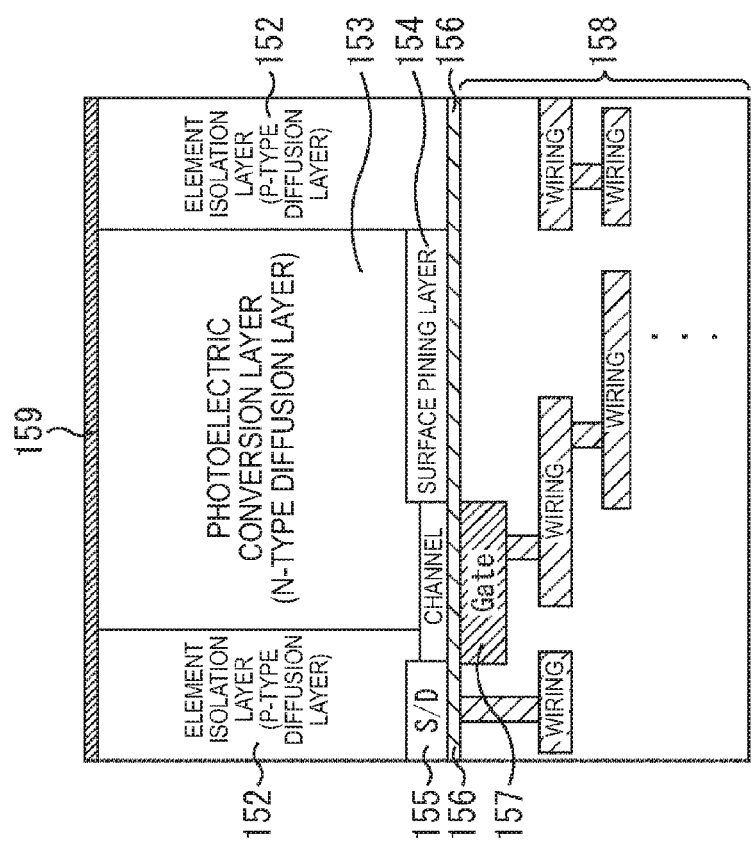
FIGS. 16A-B are figures which describe a manufacturing method of a solid-state imaging apparatus applicable to the present disclosure.
Figure 16B:
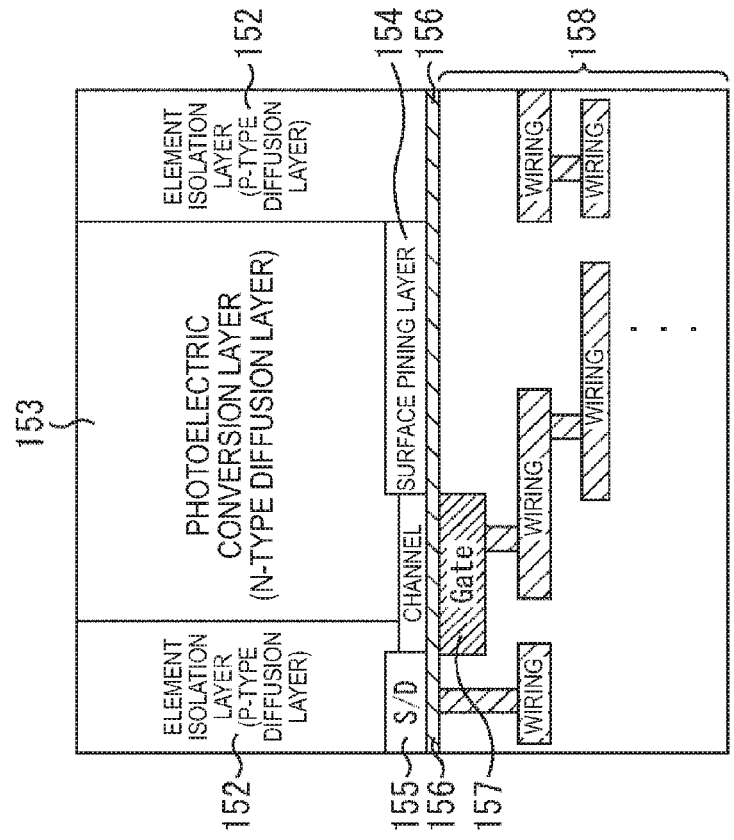

Then, as shown in FIG. 16A, the semiconductor substrate 151 is polished until the N-type diffusion layers 153 are exposed as photoelectric conversion layers, and afterwards, as shown in FIG. 16B, a rear surface pining layer 159 is formed on the exposed surface after polishing. For example, the rear surface pining layer 159 corresponds to the fixed charge film (SCF) 39 of FIG. 13.

Next, as shown in FIG. 17A, high concentration P-type diffusion layers (P++) 160 for substrate contact are formed on the substrate rear surface side of the P-type diffusion layers 152, and afterwards, as shown in FIG. 17B, an insulation film 161 is formed on the upper surface of the rear surface pining layer 159. For example, the P-type diffusion layers (P++) 160 correspond to the P++ semiconductor regions 37 of FIG. 13, and the insulation film 161 corresponds to the silicon oxide film 40 of FIG. 13.

Figure 18A:
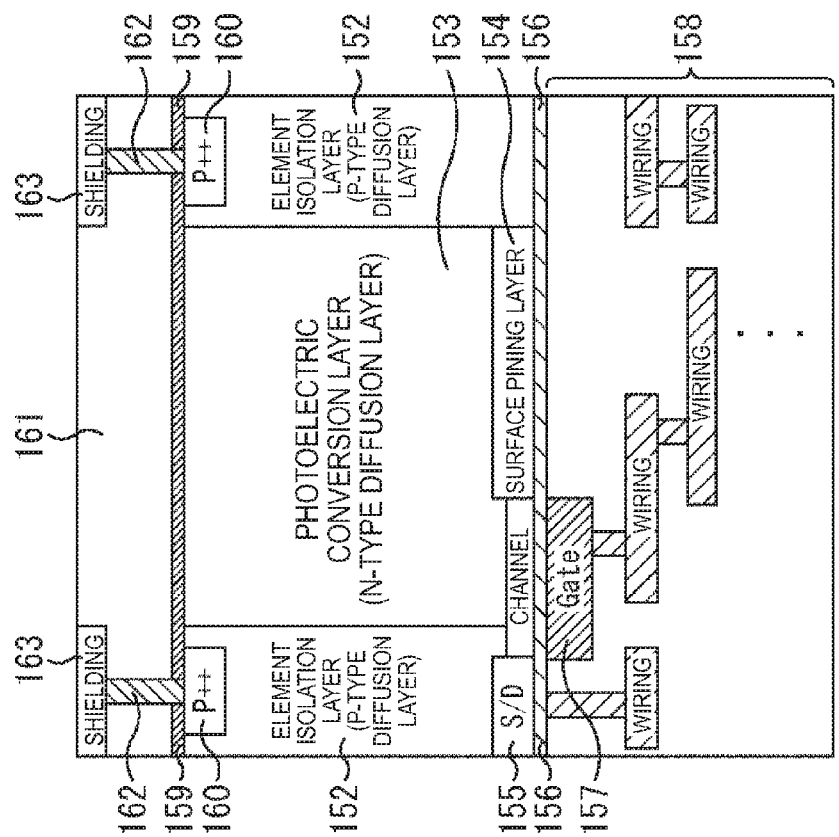
FIGS. 18A-B are figures which describe a manufacturing method of a solid-state imaging apparatus applicable to the present disclosure.
Figure 18B:
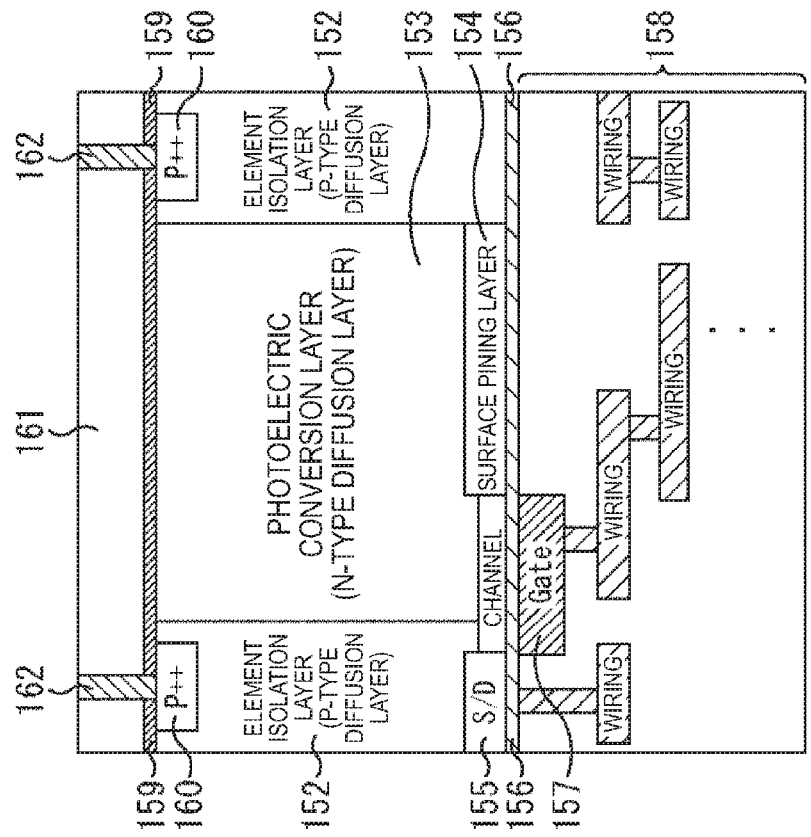

Then, as shown in FIG. 18A, contact sections 162 are formed, by etching the insulation film 161 so as to contact the P-type diffusion layers (P++) 160 and embedding a conductive material, and afterwards, as shown in FIG. 18B, shielding members 163 using a conductive material are formed on the upper parts of the contact sections 162. For example, the contact sections 162 correspond to the contact sections 141 of FIG. 13, and the shielding members 163 correspond to the shielding members 38 of FIG. 13.

Finally, as shown in FIG. 19A, a color filter 164 is formed on the upper surface of the shielding members 163 and the insulation film 161, and additionally, as shown in FIG. 19B, an on-chip lens 165 is formed on the upper side of the color filter 164.

As described above, a solid-state imaging apparatus 1 can be manufactured in which there is contact with a substrate by connecting the conductive shielding members 163 with the P-type diffusion layers (P++) 160 of the P-type diffusion layers 152, which are element isolation layers.

Note that, while a solid-state imaging apparatus has been described in the above example, which uses electrons as signal charges by setting a first conductivity type as a P-type and a second conductivity type as an N-type, the present disclosure can also be applicable to a solid-state imaging apparatus which uses electron holes as signal charges. That is, each of the above described semiconductor regions can be constituted with semiconductor layers of inverse conductivity types, by setting a first conductivity type as an N-type and a second conductivity type as a P-type.

<Application Example of the Electronic Apparatus>

The above described solid-state imaging apparatus 1 can be applied, for example, to various types of electronic apparatuses, such as an imaging apparatus such as a digital still camera or a digital video camera, a mobile phone which includes an imaging function, or an audio player which includes an imaging function.

Figure 20:
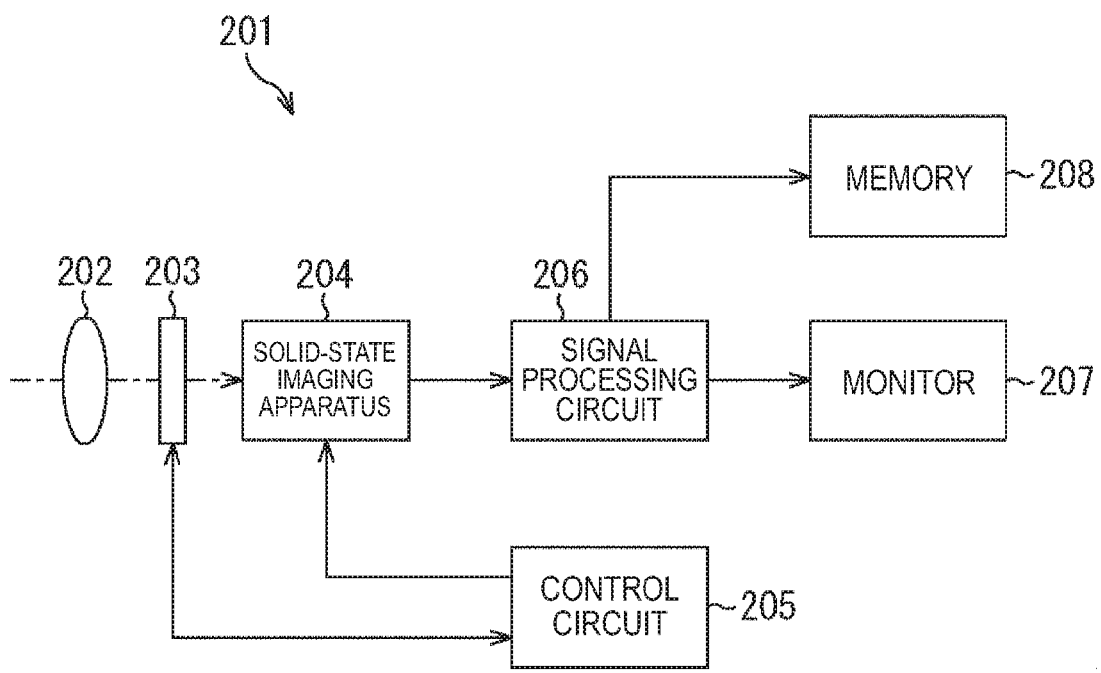
FIG. 20 is a block diagram which shows a configuration example of an imaging apparatus as an electronic apparatus applicable to the present embodiment.

FIG. 20 is a block diagram which shows a configuration example of an imaging apparatus as an electronic apparatus applicable to the present disclosure.

An imaging apparatus 201 shown in FIG. 20 is constituted by including an optical system 202, a shutter apparatus 203, a solid-state imaging apparatus 204, a control circuit 205, a signal processing circuit 206, a monitor 207 and a memory 208, and is capable of capturing still images and moving images.

The optical system 202 is constituted by having one or a plurality of lenses, guides light (incident light) from a photographic subject to the solid-state imaging apparatus 204, and forms an image on the light receiving surface of the solid-state imaging apparatus 204.

The shutter apparatus 203 is arranged between the optical system 202 and the solid-state imaging apparatus 204, and controls a light incident period and shielding period of the solid-state imaging apparatus 204, in accordance with a control of the control circuit 205.

The solid-state imaging apparatus 204 is constituted by the above described solid-state imaging apparatus 1. The solid-state imaging apparatus 204 accumulates signal charges at fixed intervals, in accordance with light which forms an image on the light receiving surface via the optical system 202 and the shutter apparatus 203. The signal charges accumulated in the solid-state imaging apparatus 204 are transferred in accordance with driving signals (timing signals) supplied from the control circuit 205. The solid-state imaging apparatus 204 may be constituted as one chip by this unit, or may be constituted as one part of a camera module packaged together with the optical system 202 through to the signal processing circuit 206 or the like.

The control circuit 205 drives the solid-state imaging apparatus 204 and the shutter apparatus 203, by outputting driving signals which control a transfer operation of the solid-state imaging apparatus 204 and a shutter operation of the shutter apparatus 203.

The signal processing circuit 206 applies various types of signal processes to the pixel signals output from the solid-state imaging apparatus 204. The images (image data) obtained from the signal processes applied by the signal processing circuit 206 are supplied to the monitor 207 and displayed, or are supplied to the memory 208 and stored (recorded).

The embodiments of the present disclosure are not limited to the embodiments described above, and various changes are possible in a range which does not deviate from the content of the present disclosure.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A solid-state imaging apparatus including:
a plurality of photoelectric conversion regions which photoelectrically convert light incident from a rear surface side of a semiconductor substrate;
element isolation regions formed between the plurality of photoelectric conversion regions arranged in a matrix shape; and
shielding members formed on upper surfaces of the element isolation regions,
wherein the element isolation regions have high impurity concentration regions of a high impurity concentration connected to at least a part of the shielding members.

(2) The solid-state imaging apparatus according to (1),
wherein the high impurity concentration regions of the element isolation regions are directly connected to at least a part of the shielding members.

(3) The solid-state imaging apparatus according to (1) or (2),
wherein the high impurity concentration regions of the element isolation regions are present only in a surrounding part of the photoelectric conversion regions which photoelectrically convert red light.

(4) The solid-state imaging apparatus according to (1) or (2),
wherein each of the element isolation regions between the plurality of photoelectric conversion regions has one of the high impurity concentration regions, and
wherein the high impurity concentration regions are directly connected to the shielding members on upper surfaces of the high impurity concentration regions.

(5) The solid-state imaging apparatus according to any one of (1) to (4),
wherein a predetermined voltage is supplied to the shielding members from a peripheral circuit arranged surrounding a pixel array which includes the plurality of photoelectric conversion regions and the element isolation regions.

(6) The solid-state imaging apparatus according to any one of (1) to (5),
wherein a predetermined voltage is supplied to the shielding members, via a through electrode, from a peripheral circuit arranged surrounding a pixel array which includes the plurality of photoelectric conversion regions and the element isolation regions.

(7) The solid-state imaging apparatus according to any one of (1) to (6),
wherein the high impurity concentration regions of the element isolation regions are formed at positions separated from interfaces of the element isolation regions on a rear surface side of the semiconductor substrate, and
wherein the shielding members are embedded inside the element isolation regions.

(8) The solid-state imaging apparatus according to (3), (5), or (6)
wherein the high impurity concentration regions of the element isolation regions are indirectly connected to at least a part of the shielding members via a conductive material different to a material of the shielding members.

(9) A manufacturing method of a solid-state imaging apparatus, including:
forming a plurality of photoelectric conversion regions which photoelectrically convert light incident from a rear surface side of a semiconductor substrate;
forming high impurity concentration regions, on rear surface sides of element isolation regions between the plurality of photoelectric conversion regions arranged in a matrix shape, the high impurity concentration regions having an impurity concentration higher than an impurity concentration of the element isolation regions; and
forming shielding members, on upper surfaces of the high impurity concentration regions, connected to the high impurity concentration regions.

(10) An electronic apparatus, including:
a solid-state imaging apparatus including
a plurality of photoelectric conversion regions which photoelectrically convert light incident from a rear surface side of a semiconductor substrate;
element isolation regions formed between the plurality of photoelectric conversion regions arranged in a matrix shape; and
shielding members formed on upper surfaces of the element isolation regions,
wherein the element isolation regions have high impurity concentration regions of a high impurity concentration connected to at least a part of the shielding members.

What is claimed is:

1. A manufacturing method of an imaging apparatus, comprising:
forming a plurality of photoelectric conversion regions which photoelectrically convert light incident from a rear surface side of a semiconductor substrate;
forming high impurity concentration regions, on rear surface sides of element isolation regions between the plurality of photoelectric conversion regions arranged in a matrix shape, the high impurity concentration regions having an impurity concentration higher than an impurity concentration of the element isolation regions; and
forming shielding members, on upper surfaces of the high impurity concentration regions, connected to the high impurity concentration regions.

2. The manufacturing method according to claim 1, wherein the high impurity concentration regions of the element isolation regions are connected to at least a part of the shielding members via a conductive material.

3. The manufacturing method according to claim 1, wherein the high impurity concentration regions of the element isolation regions are present only in a surrounding part of the photoelectric conversion regions which photoelectrically convert red light.

4. The manufacturing method according to claim 1, wherein each of the element isolation regions between the plurality of photoelectric conversion regions has one of the high impurity concentration regions.

5. The manufacturing method according to claim 1, wherein the high impurity concentration regions of the element isolation regions are formed at positions separated from interfaces of the element isolation regions on a rear surface side of the semiconductor substrate.

6. The manufacturing method according to claim 1, wherein the high impurity concentration regions of the element isolation regions are connected to at least a part of the shielding members via a conductive material different from a material of the shielding members.

7. The manufacturing method according to claim 1, further including forming a wiring layer on a front surface side of the semiconductor substrate.

8. The manufacturing method according to claim 1, further including forming a pinning layer on the rear surface side of the semiconductor substrate.

9. The manufacturing method according to claim 8, further including forming an insulating layer on a surface of the pinning layer.

10. The manufacturing method according to claim 9, wherein portions of the shielding members are disposed on portions of the insulating layer.

11. A manufacturing method of an electronic apparatus, the method comprising:
    forming an imaging apparatus by:
        forming a plurality of photoelectric conversion regions which photoelectrically convert light incident from a rear surface side of a semiconductor substrate,
        forming high impurity concentration regions, on rear surface sides of element isolation regions between the plurality of photoelectric conversion regions arranged in a matrix shape, the high impurity concentration regions having an impurity concentration higher than an impurity concentration of the element isolation regions, and
        forming shielding members, on upper surfaces of the high impurity concentration regions, connected to the high impurity concentration regions; and
    forming a shutter apparatus between an optical system and the imaging apparatus.

12. The manufacturing method according to claim 11, wherein the high impurity concentration regions of the element isolation regions are connected to at least a part of the shielding members via a conductive material.

13. The manufacturing method according to claim 11, wherein the high impurity concentration regions of the element isolation regions are present only in a surrounding part of the photoelectric conversion regions which photoelectrically convert red light.

14. The manufacturing method according to claim 11, wherein each of the element isolation regions between the plurality of photoelectric conversion regions has one of the high impurity concentration regions.

15. The manufacturing method according to claim 11, wherein the high impurity concentration regions of the element isolation regions are formed at positions separated from interfaces of the element isolation regions on a rear surface side of the semiconductor substrate.

16. The manufacturing method according to claim 11, wherein the high impurity concentration regions of the element isolation regions are connected to at least a part of the shielding members via a conductive material different from a material of the shielding members.

17. The manufacturing method according to claim 11, further including forming a wiring layer on a front surface side of the semiconductor substrate.

18. The manufacturing method according to claim 11, further including forming a pinning layer on the rear surface side of the semiconductor substrate.

19. The manufacturing method according to claim 18, further including forming an insulating layer on a surface of the pinning layer.

20. The manufacturing method according to claim 19, wherein portions of the shielding members are disposed on portions of the insulating layer.

* * * * *